United States Patent
Takasugi

(10) Patent No.: US 9,293,227 B1
(45) Date of Patent: Mar. 22, 2016

(54) SEMICONDUCTOR MEMORY APPARATUS AND SEMICONDUCTOR INTEGRATED CIRCUIT APPARATUS

(71) Applicant: Powerchip Technology Corporation, Hsinchu (TW)

(72) Inventor: Atsushi Takasugi, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/797,190

(22) Filed: Jul. 13, 2015

(30) Foreign Application Priority Data

Feb. 16, 2015 (JP) .................................. 2015-027909

(51) Int. Cl.
| | |
|---|---|
| G11C 16/04 | (2006.01) |
| G11C 29/00 | (2006.01) |
| G11C 17/16 | (2006.01) |
| G11C 17/18 | (2006.01) |

(52) U.S. Cl.
CPC ................ *G11C 29/76* (2013.01); *G11C 17/16* (2013.01); *G11C 17/18* (2013.01); *G11C 29/78* (2013.01); *G11C 16/04* (2013.01); *G11C 29/82* (2013.01)

(58) Field of Classification Search
CPC ..... G11C 29/82; G11C 16/04; G11C 16/0483; G11C 29/76; G11C 29/789
USPC .......................... 365/185.09, 230.06, 185.21
See application file for complete search history.

(56) References Cited

U.S. PATENT DOCUMENTS

| | | | |
|---|---|---|---|
| 4,228,528 A | 10/1980 | Cenker et al. | |
| 2008/0037341 A1 | 2/2008 | Ouellette et al. | |
| 2011/0267876 A1* | 11/2011 | Min et al. ................. | G11C 8/12 365/163 |

* cited by examiner

*Primary Examiner* — Jason Lappas
(74) *Attorney, Agent, or Firm* — Jianq Chyun IP Office

(57) ABSTRACT

A memory control circuit 10 controls an operation of reading stored data from a memory cell 50 connected to a word line WL and a bit line BL based on an address Address including a row address Ax and a column address Ay. When the address Address includes redundancy addresses P1 to P4 designating a word line WLa or a bit line BLc connected to a specific memory cell Cc, redundancy decoders 13-1 to 13-4 replace the specific memory cell Cc with a redundancy memory cell RCc connected to redundancy word lines RWL1 and RWL2 or redundancy bit lines RBL1 and RBL2. Redundancy address latch circuits 12-1 to 12-4 respectively hold the redundancy addresses P1 to P4, and erase the held redundancy addresses P1 to P4 based on a reset signal RS inputted from the memory control circuit 10.

9 Claims, 28 Drawing Sheets

SEMICONDUCTOR MEMORY APPARATUS AND SEMICONDUCTOR INTEGRATED CIRCUIT APPARATUS

CROSS-REFERENCE TO RELATED APPLICATION

This application claims the priority benefit of Japan application serial no. 2015-027909, filed on Feb. 16, 2015. The entirety of the above-mentioned patent application is hereby incorporated by reference herein and made a part of this specification.

BACKGROUND OF THE INVENTION

1. Field of the Invention

The invention relates to a semiconductor memory apparatus, such as static random access memory (SRAM) or dynamic random access memory (DRAM), etc., and a semiconductor integrated circuit apparatus including the semiconductor memory apparatus.

2. Description of Related Art

Generally, in a semiconductor memory apparatus, a redundancy circuit is provided to realize a redundancy repair function for repairing a defective memory cell being a main cause for reduction in yield rate. In Patent Document 1, the following redundancy circuit structure is adopted. In a memory array having memory cells arranged in a matrix, a redundancy row or a redundancy column that includes a preparatory memory cell capable of replacing a defective memory cell in a circuit is arranged, and a redundancy address is stored in a non-volatile manner by cut-off of a fuse element.

FIG. 22 is a block diagram showing a structure of a memory circuit 100 according to the prior art. In the memory circuit 100 shown in FIG. 22, an address of a defective memory cell is stored, in redundancy fuse circuits 4-1 to 4-4 in a non-volatile manner, as a redundancy address for replacing with a redundancy row or a redundancy column. The redundancy fuse circuits 4-1 to 4-4 may use a metal or polysilicon fuse element blown by laser, or an antifuse applying an excessive gate voltage to a transistor to turn on the transistor, a one-time programmable (OTP) read-only memory cell or a flash memory cell, etc., and are known to have various circuit structures.

FIGS. 23 to 26 are block diagrams showing structures of semiconductor integrated circuit apparatuses according to the prior art. In a semiconductor integrated circuit apparatus of a system on chip (SOC) or an application-specific integrated circuit (ASIC), as shown in FIGS. 23 to 26, there is also known a method of storing a redundancy address in a region other than memory circuits 100A to 100D. In FIG. 23, the redundancy fuse circuits 4-1 to 4-4 are arranged in an external region 220 outside the memory circuit 100A to store a redundancy address, and the redundancy address from the redundancy fuse circuits 4-1 to 4-4 is stored into redundancy address storage circuits 41-1 to 41-4 at power-on.

In the semiconductor integrated circuit apparatuses shown in FIGS. 24 to 26, there is no use of a physical redundancy fuse circuit and the following method is adopted instead. A redundancy address is stored in advance in a flash memory 215 or the like arranged in an external region 200A outside the memory circuits 100B to 100D on a chip. In FIG. 24, the redundancy address stored in the flash memory 215 is stored into the redundancy address storage circuits 41-1 to 41-4 of the memory circuit 100B at power-on. In FIG. 25, a CPU 210 activates redundancy decoders 13-1 to 13-4 of the memory circuit 100C based on the redundancy address stored in the flash memory 215. In FIG. 26, based on the redundancy address stored in the flash memory 215, the CPU 210 separates a normal address and the redundancy address from each other, and outputs the normal address and the redundancy address respectively to an X-decoder 6, a Y-decoder 9 and the redundancy decoders 13-1 to 13-4 of the memory circuit 100D.

PRIOR-ART DOCUMENTS

Patent Documents

Patent Document 1: U.S. Pat. No. 4,228,528
Patent Document 2: US Patent Publication No. 2008/0037341

SUMMARY OF THE INVENTION

As mentioned above, in the redundancy repair function for repairing a defective memory cell of a semiconductor memory apparatus according to the prior art, a redundancy fuse circuit storing a redundancy address in a non-volatile manner is known to have various circuit structures. Furthermore, there are cases where no physical redundancy fuse circuit is used, but an alternative to the redundancy fuse circuit, such as a flash memory or the like, is adopted. During a development phase of a semiconductor memory apparatus, it is unreasonable, in view of development costs and development period, to perform development so as to support all these forms. Nevertheless, if any redundancy fuse circuit is not set, a test evaluation of the redundancy repair function in the semiconductor memory apparatus cannot be carried out. For that reason, in the prior art, during the development phase of the semiconductor memory apparatus, there is a problem that a test for repair for a defective memory cell cannot be efficiently carried out.

The invention is intended to provide a semiconductor memory apparatus. During a development phase of the semiconductor memory apparatus, a test for repair for a defective memory cell can be carried out with high efficiency compared to the prior art.

A semiconductor memory apparatus according to a first aspect of the invention is characterized by including a plurality of memory cells, a memory control circuit, a redundancy decoder and a plurality of redundancy address latch circuits.

The plurality of memory cells are respectively connected to a plurality of word lines and bit lines intersecting each other, and store data inputted from the bit lines.

Based on an address including a row address designating each of the word lines and a column address designating each of the bit lines, the memory control circuit controls an operation of reading the stored data from the memory cell connected to the word line and the bit line designated by the row address and the column address.

When the address includes a redundancy address designating a word line or bit line connected to a specific memory cell, the redundancy decoder replaces the specific memory cell with a redundancy memory cell connected to a predetermined word line or bit line in the plurality of memory cells.

The plurality of redundancy address latch circuits respectively hold the redundancy addresses, and erase the held redundancy addresses based on a reset signal inputted from the memory control circuit.

The semiconductor memory apparatus according to a second aspect of the invention is defined as follows. In the semiconductor memory apparatus according to the first aspect, each of the redundancy address latch circuits holds the redundancy address based on a separately inputted enable signal.

The semiconductor memory apparatus according to a third aspect of the invention is defined as follows. In the semiconductor memory apparatus according to the first or the second aspect, a fuse circuit and a switch circuit are further included.

The fuse circuit includes fuses for storing the redundancy address in a non-volatile manner.

The switch circuit selectively switches between the redundancy address held by the redundancy address latch circuit and the redundancy address stored in the fuse circuit, and outputs the same to the redundancy decoder.

When the address includes a redundancy address from the switch circuit, the redundancy decoder replaces the specific memory cell with the redundancy memory cell.

The semiconductor memory apparatus according to a fourth aspect of the invention is defined as follows. In the semiconductor memory apparatus according to the third aspect, a first priority control circuit is further included.

When the fuse circuit has the redundancy address stored therein, the first priority control circuit causes the switch circuit to preferentially select the redundancy address stored in the fuse circuit over the redundancy address held by the redundancy address latch circuit.

The semiconductor memory apparatus according to a fifth aspect of the invention is defined as follows. In the semiconductor memory apparatus according to the first to the fourth aspects, the plurality of redundancy address latch circuits includes at least one first redundancy address latch circuit and at least one second redundancy address latch circuit.

The at least one first redundancy address latch circuit holds a redundancy row address designating the word line connected to the specific memory cell.

The at least one second redundancy address latch circuit holds a redundancy column address designating the bit line connected to the specific memory cell.

The semiconductor memory apparatus further includes a second priority control circuit. The second priority control circuit controls to preferentially select either of the first and the second redundancy address latch circuits, so as to write the redundancy row address or the redundancy column address in the selected redundancy address latch circuit.

The semiconductor memory apparatus according to a sixth aspect of the invention is defined as follows. In the semiconductor memory apparatus according to the fifth aspect, a counter is further included.

The counter counts a number of the first redundancy address latch circuit holding the redundancy row address and a number of the second redundancy address latch circuit holding the redundancy column address.

The semiconductor memory apparatus according to a seventh aspect of the invention is defined as follows. In the semiconductor memory apparatus according to the sixth aspect, a sensor is further included.

The sensor detects a temperature or a supply voltage of the semiconductor memory apparatus.

The second priority control circuit preferentially selects either of the first and the second redundancy address latch circuits depending on the temperature or the supply voltage detected by the sensor.

The semiconductor memory apparatus according to an eighth aspect of the invention is defined as follows. In the semiconductor memory apparatus according to the first to the seventh aspects, each of the redundancy address latch circuits includes a volatile storage circuit.

A semiconductor integrated circuit apparatus according to a ninth aspect of the invention is characterized by including the semiconductor memory apparatus according to the first to the eighth aspects.

According to the semiconductor memory apparatus according to the invention, during a development phase, a test for repair for a defective memory cell can be carried out with high efficiency compared to the prior art.

DETAILED DESCRIPTION OF DISCLOSED EMBODIMENTS

Figure 1:
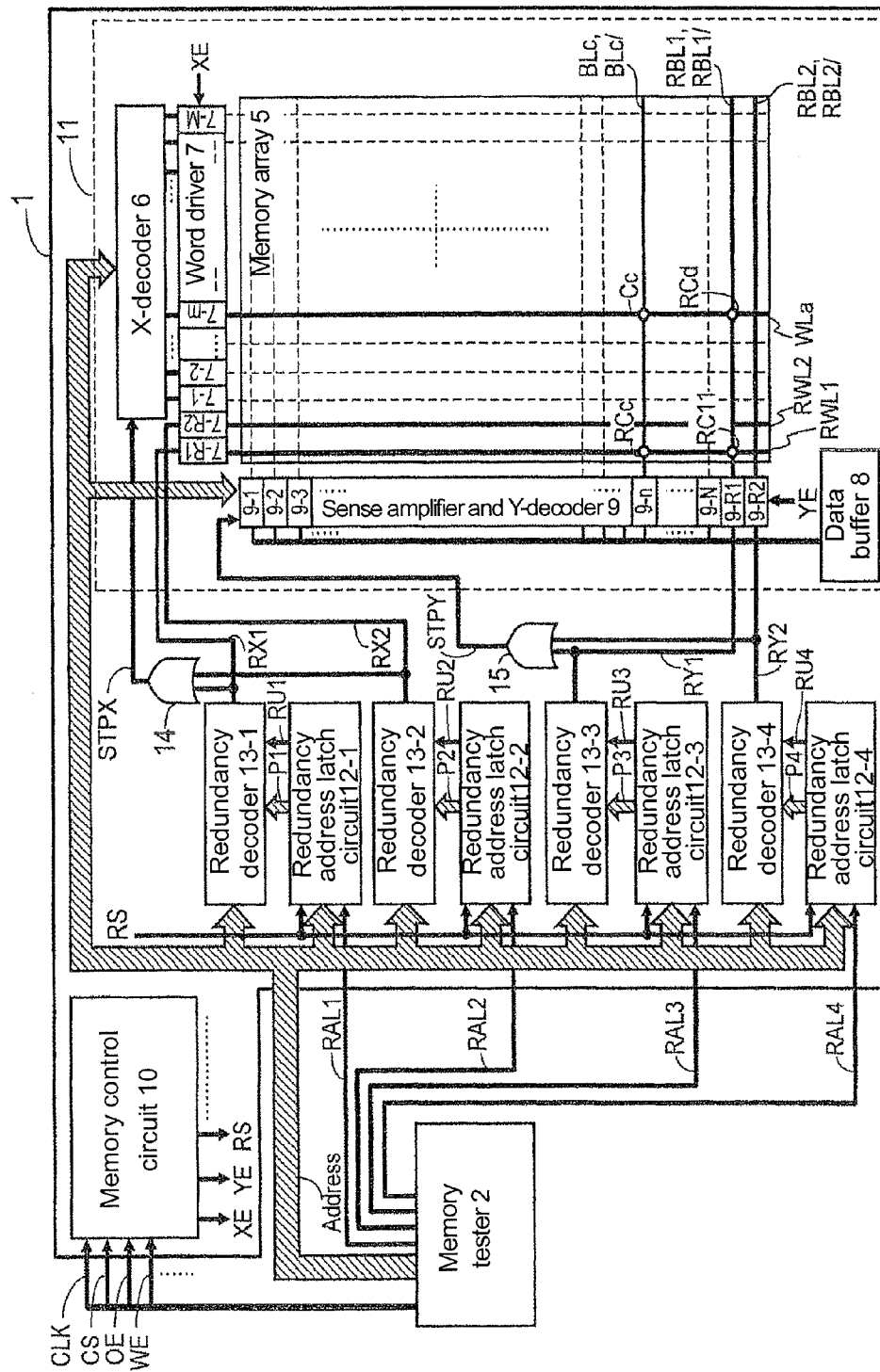
FIG. 1 is a block diagram showing a structure of a memory circuit 1 according to Embodiment 1 of the invention together with a memory tester 2.

The embodiments of the invention are described hereinafter with reference to the drawings. In addition, in the following embodiments, the same components are denoted by the same reference numerals.

Embodiment 1

FIG. 1 is a block diagram showing a structure of the memory circuit 1 according to Embodiment 1 of the invention together with the memory tester 2. In FIG. 1, the memory circuit 1 is configured by including a memory control circuit 10, the memory array and peripheral circuit 11, redundancy address latch circuits 12-1 to 12-4, the redundancy decoders 13-1 to 13-4, and OR gates 14 and 15. The memory array and peripheral circuit 11 includes a memory array 5, the X-decoder 6, a word driver 7, a data buffer 8, and a sense amplifier and Y-decoder 9.

In FIG. 1, the memory circuit 1 includes, e.g., a volatile semiconductor memory apparatus such as SRAM or the like, and is tested by the external memory tester 2. The memory tester 2 outputs a clock signal CLK, a chip selection signal CS, an output enable signal OE and a write enable signal WE to the memory control circuit 10. In addition, the memory tester 2 outputs an address Address including a row address Ax and a column address Ay to the X-decoder 6, the Y-decoder 9, the redundancy address latch circuits 12-1 to 12-4 and the redundancy decoders 13-1 to 13-4. Furthermore, the memory tester 2 outputs redundancy address write enable signals RAL1 to RAL4 to the redundancy address latch circuits 12-1 to 12-4 respectively.

If the chip selection signal CS is at a high level, the memory control circuit 10 controls an operation of the memory circuit 1 in synchronization with the clock signal CLK. Based on the output enable signal OE or the write enable signal WE, the memory control circuit 10 generates a word driver activation signal XE to activate the word driver 7 and generates a Y-decoder activation signal YE to activate the Y-decoder 9. Furthermore, the memory control circuit 10 generates a reset signal RS for resetting the redundancy address latch circuits 12-1 to 12-4 and outputs the same to each of the redundancy address latch circuits 12-1 to 12-4.

The redundancy address latch circuits 12-1 to 12-4 include, e.g., SRAM. When the redundancy address write enable signals RAL1 and RAL2 are at a high level, the redundancy address latch circuits 12-1 and 12-2 respectively capture the row address Ax in the address Address as redundancy row addresses P1 and P2. When the redundancy address write enable signals RAL3 and RAL4 are at a high level, the redundancy address latch circuits 12-3 and 12-4 respectively capture the column address Ay in the address Address as redundancy column addresses P3 and P4. When the redundancy address write enable signals RAL1 to RAL4 are at a low level, the redundancy address latch circuits 12-1 to 12-4 respectively hold the captured redundancy addresses, and erase the held redundancy addresses based on the high-level reset signal RS. The redundancy address latch circuits 12-1 to 12-4 respectively output the held redundancy addresses P1 to P4 to the redundancy decoders 13-1 to 13-4, and respectively output redundancy address use flag signals RU1 to RU4 to the redundancy decoders 13-1 to 13-4, the redundancy address use flag signals RU1 to RU4 showing whether or not a redundancy address is held.

The redundancy decoders 13-1 and 13-2 respectively decode the row address Ax in the address Address based on the redundancy address use flag signals RU1 and RU2, and determine whether or not the decoded row address Ax matches the redundancy row addresses P1 and P2. If the redundancy decoders 13-1 and 13-2 respectively determine that the row address Ax matches the redundancy row addresses P1 and P2, the redundancy decoders 13-1 and 13-2 generate high-level redundancy use determination signals RX1 and RX2; if a non-match is determined, the redundancy decoders 13-1 and 13-2 generate low-level redundancy use determination signals RX1 and RX2. The redundancy decoders 13-1 and 13-2 respectively output the redundancy use determination signals RX1 and RX2 to the OR gate 14 and the word driver 7.

The redundancy decoders 13-3 and 13-4 respectively decode the column address Ay in the address Address based on the redundancy address use flag signals RU3 and RU4, and determine whether or not the decoded column address Ay matches the redundancy column addresses P3 and P4. If the redundancy decoders 13-3 and 13-4 respectively determine that the column address Ay matches the redundancy column addresses P3 and P4, the redundancy decoders 13-3 and 13-4 generate high-level redundancy use determination signals RX3 and RX4; if a non-match is determined, the redundancy decoders 13-3 and 13-4 generate low-level redundancy use determination signals RX3 and RX4. The redundancy decoders 13-3 and 13-4 respectively output the redundancy use determination signals RX3 and RX4 to the OR gate 15 and the Y-decoder 9.

The OR gate 14 performs a logical OR operation on the redundancy use determination signals RX1 and RX2, generates an X-decoder deactivation signal STPX showing a result of the operation and outputs the same to the X-decoder 6. The OR gate 15 performs a logical OR operation on the redundancy use determination signals RX3 and RX4, generates a Y-decoder deactivation signal STPY showing a result of the operation and outputs the same to the Y-decoder 9.

Moreover, in the present embodiment, to simplify the description, the memory circuit 1 is configured to include the redundancy address latch circuits 12-1 to 12-4 and the redundancy decoders 13-1 and 13-2 to be applicable to two redundancy rows and two redundancy columns. However, the invention is not limited thereto and is applicable to an arbitrary number of redundancy rows and redundancy columns.

When the X-decoder deactivation signal STPX is at a low level, the X-decoder 6 decodes the row address Ax in the address Address and outputs the same to the word driver 7, and when the X-decoder deactivation signal STPX is at a high level, the X-decoder 6 stops its operation.

Figure 2:
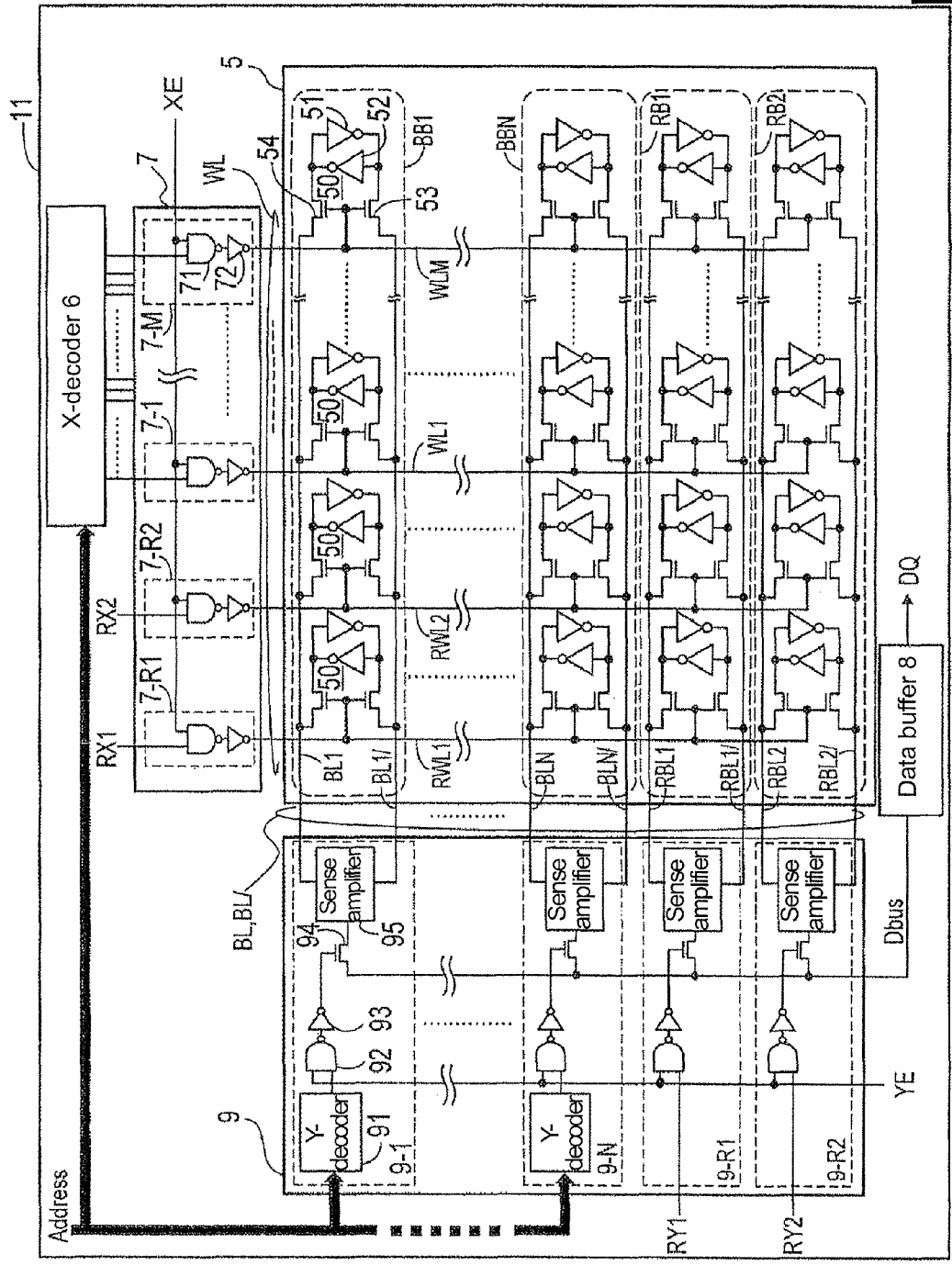
FIG. 2 is a circuit diagram showing a structure of a memory array and peripheral circuit 11 in the memory circuit 1 in FIG. 1.

FIG. 2 is a circuit diagram showing a structure of the memory array and peripheral circuit 11 in the memory circuit 1 in FIG. 1. Hereinafter, the structure of the memory array and peripheral circuit 11 is described with reference to FIGS. 1 and 2.

In FIG. 2, the word driver 7 includes: word driver sections 7-1 to 7-M, respectively connected to a plurality of (M) word lines WL; and redundancy word driver sections 7-R1 and 7-R2, respectively connected to redundancy word lines RWL1 and RWL2. The word driver section 7-$m$ (m=1, 2, . . . , M) and the redundancy word driver sections 7-R1 and 7-R2 each include a NAND gate 71 and an inverter 72. As shown in FIG. 1, in the word driver 7, the word driver section 7-$m$ for a word line WLa designated by a row address Axa drives the word line WLa. In addition, the redundancy word driver sections 7-R1 and 7-R2 respectively drive the redundancy word lines RWL1 and RWL2 based on the redundancy use determination signals RX1 and RX2.

The memory array 5 is obtained by arranging a plurality of memory cells 50 in a matrix. The memory cell 50 includes a pair of inverters 51 and 52 connected to each other, and transistors 53 and 54. In the memory array 5, the memory cells 50 respectively connected to a plurality of (N) bit line pairs BL1, BL1/ to BLN, BLN/constitute column sections BB1 to BBN. The memory cells 50 of each column section BBn (n=1, 2, . . . , N) are respectively connected to word lines WL1 to WLM or the redundancy word lines RWL1 and RWL2. The memory cells 50 respectively connected to redundancy bit line pairs RBL1, RBL1/ and RBL2, RBL2/ constitute redundancy column sections RB1 and RB2. The memory cells 50 of the redundancy column sections RB1 and RB2 are respectively connected to the word lines WL1 to WLM or the redundancy word lines RWL1 and RWL2.

The sense amplifier and Y-decoder 9 includes: Y-decoder sections 9-1 to 9-N, respectively connected to the bit line pairs BL1, BL1/ to BLN, BLN/; and redundancy Y-decoder sections 9-R1 and 9-R2, respectively connected to the redundancy bit line pairs RBL1, RBL1/ and RBL2, RBL2/. The Y-decoder sections 9-1 to 9-N each include a Y-decoder 91 decoding the column address Ay in the address Address, a NAND gate 92, an inverter 93, a transistor 94, and a sense amplifier 95 amplifying data of the memory cell 50. The redundancy Y-decoder sections 9-R1 and 9-R2 each include the NAND gate 92, the inverter 93, the transistor 94, and the sense amplifier 95.

When the Y-decoder deactivation signal STPY is at a low level, the Y-decoder section 9-$n$ connected to the bit line pair BLc, BLc/ designated by the column address Aya performs data transmission with the data buffer 8 through a data bus Dbus. In addition, when the Y-decoder deactivation signal STPY is at a high level, the redundancy Y-decoder sections 9-R1 and 9-R2 respectively perform data transmission with the data buffer 8 through the data bus Dbus based on redundancy use determination signals RY1 and RY2.

Figure 3:
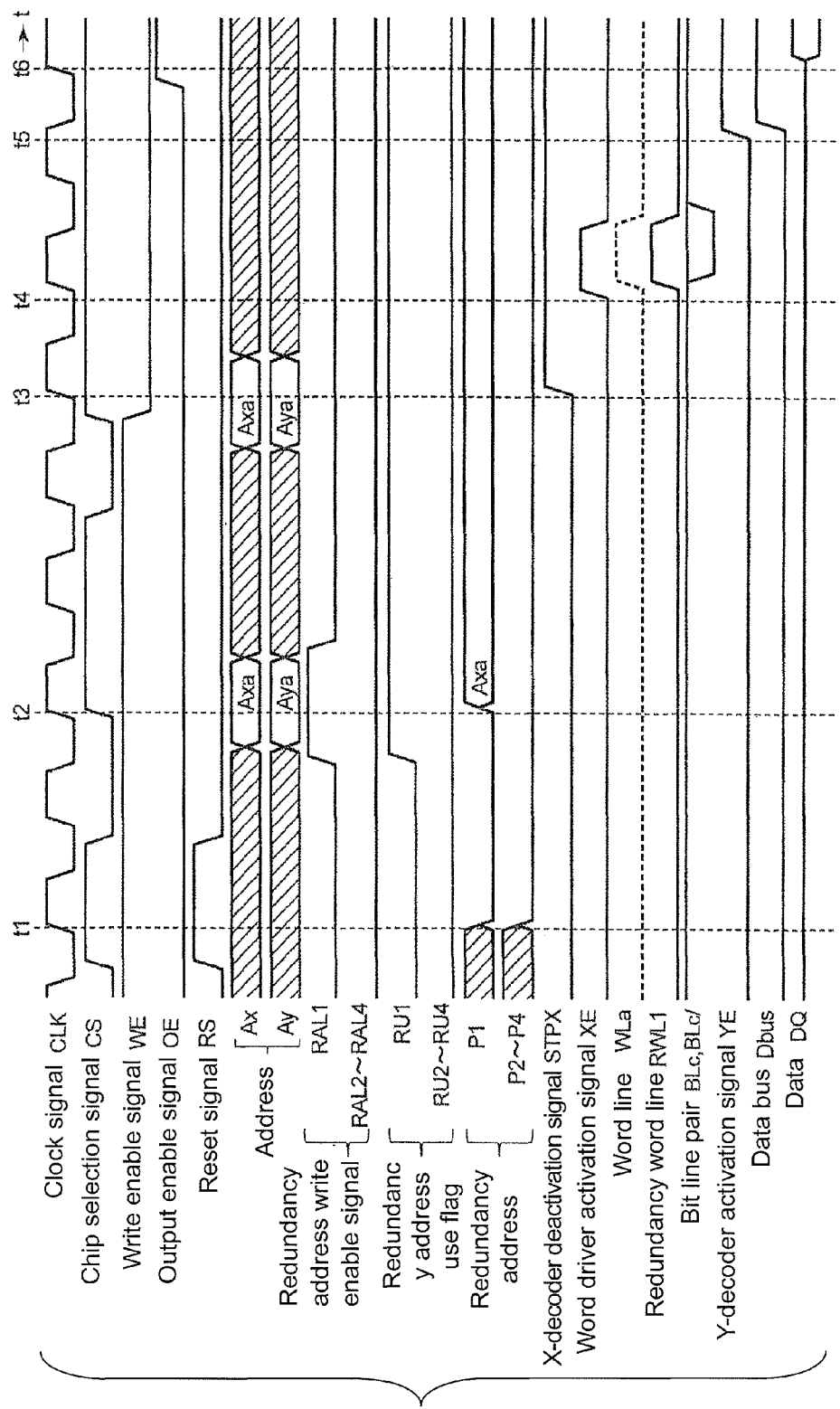
FIG. 3 is a timing chart of signals showing a reading operation of the memory circuit 1 in FIG. 1.

FIG. 3 is a timing chart of signals showing a reading operation of the memory circuit 1 in FIG. 1. An operation of reading data using a redundancy address latch circuit is described with reference to FIGS. 1 and 3. In the following, to simplify the description, a case where a redundancy row address is set using the redundancy address latch circuit 12-1 is described. However, the same process may be applied in setting a redundancy column address.

In FIG. 3, firstly, at time t1, a high-level chip selection signal CS is inputted to the memory control circuit 10. The memory control circuit 10 generates a high-level reset signal RS and outputs the same to each of the redundancy address latch circuits 12-1 to 12-4. Thereupon, the redundancy address latch circuits 12-1 to 12-4 are reset, and the redundancy addresses P1 to P4 all become "00 . . . 0."

Next, at time t2, the memory tester 2 inputs the address Address including the row address Axa and the column address Aya to the memory circuit 1, and inputs a high-level redundancy address write enable signal RAL1 to the redundancy address latch circuit 12-1. Since the redundancy address write enable signals RAL2 to RAL4 are at a low level, only the row address Axa is written in and held by the redundancy address latch circuit 12-1 on a rising edge of the clock signal CLK.

At this moment, the redundancy address latch circuit 12-1 generates a high-level redundancy address use flag signal RU1 and outputs the same to the redundancy decoder 13-1, and the redundancy decoder 13-1 is activated. On the other hand, the redundancy address use flag signals RU2 to RU4 are maintained at a low level, and the redundancy decoders 13-2 to 13-4 are not activated. That is, after the reset by the reset signal RS, as long as the redundancy address latch circuits 12-1 to 12-4 are not selected by the redundancy address write enable signals RAL1 to RAL4 to latch the redundancy addresses, the redundancy decoders 13-1 to 13-4 cannot be used.

Next, at time t3, the high-level chip selection signal CS is inputted to the memory control circuit 10, and the address Address is inputted to the memory circuit 1 on the rising edge of the clock signal CLK. Here, the redundancy address P1 held by the redundancy address latch circuit 12-1 matches the row address Axa in the inputted address Address. Hence, the redundancy decoder 13-1 generates a high-level redundancy use determination signal RX1 and outputs the same to the OR gate 14 and the word driver 7. The OR gate 14 generates a high-level X-decoder deactivation signal STPX and outputs the same to the X-decoder 6, and the X-decoder 6 stops its operation.

Next, at time t4, the memory control circuit 10 generates a high-level word driver activation signal XE and outputs the same to the word driver 7, and the word driver 7 selects the redundancy word line RWL1. The selected redundancy word line RWL1 becomes high level. Data stored in a redundancy memory cell RCc is transmitted to the bit line pair BLc, BLc/ in the column section BBc, and is amplified by the sense amplifier 95 connected to the bit line pair BLc, BLc/ (see FIG. 2). Similarly to the redundancy memory cell RCc, a plurality of memory cells 50 connected to the redundancy word line RWL1 respectively transmit their stored data to the bit line pairs BL, BL/, and the transmitted data is amplified by the sense amplifier 95 connected to each of the bit line pairs BL, BL/. On the other hand, although the row address Axa is inputted, the word line WLa is not selected due to the stop of the X-decoder 6 caused by the X-decoder deactivation signal STPX.

Next, at time t5, the memory control circuit 10 generates a high-level Y-decoder activation signal YE and outputs the same to the Y-decoder 9. In this case, since no redundancy column is in use, a normal column function is achieved. That is, in response to the high-level Y-decoder activation signal YE at time t5, the Y-decoder section 9-$n$ corresponding to the column address Aya inputted at time t3 transmits the data amplified by the sense amplifier 95 to the data bus Dbus. Next, at the rise of the clock signal CLK at time t6, the data transmitted to the data bus Dbus is outputted as data DQ through the data buffer 8.

Figure 4:
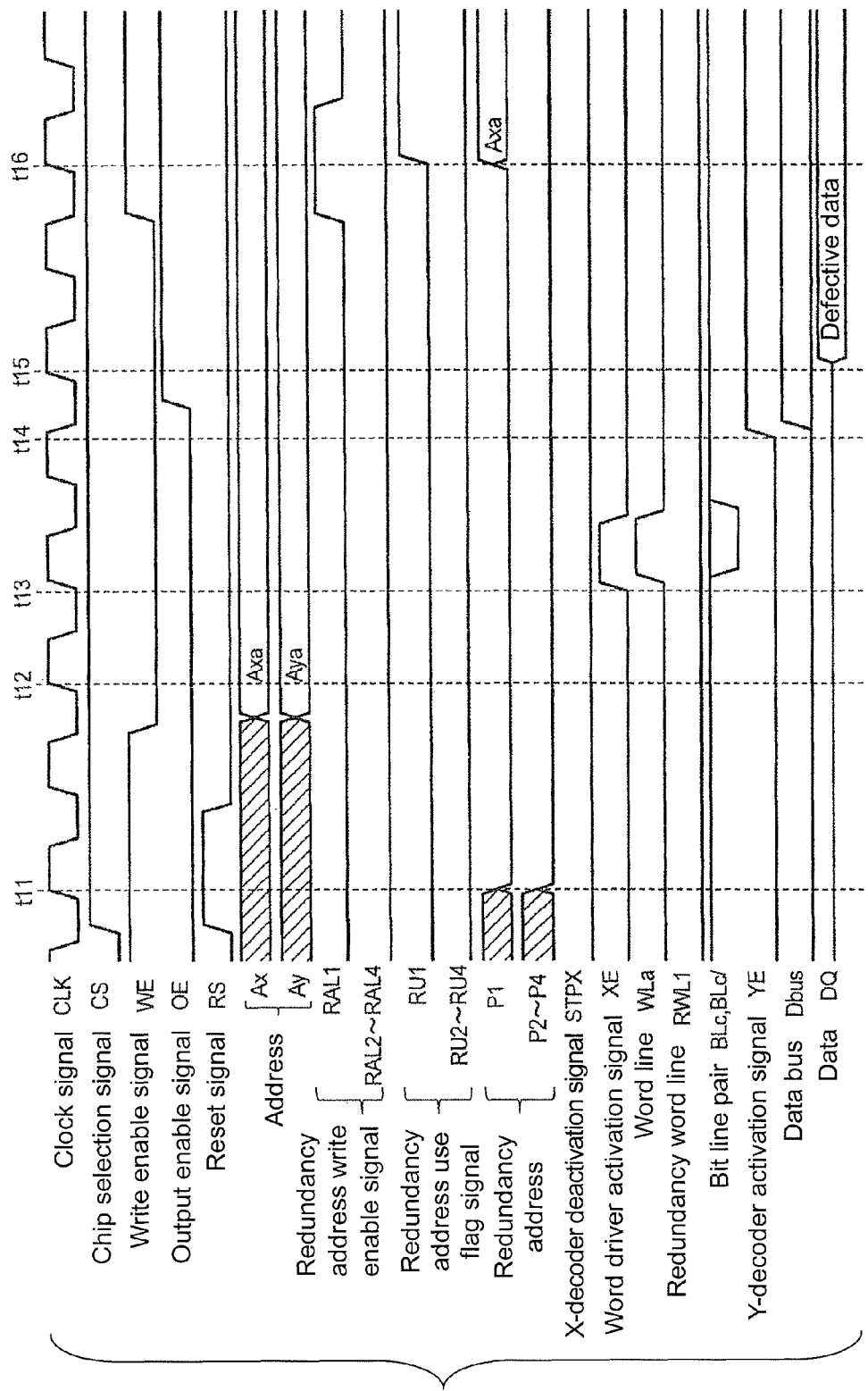
FIG. 4 is a timing chart of signals showing a redundancy address setting operation performed by the memory circuit 1 in FIG. 1 with respect to defective data.

FIG. 4 is a timing chart of signals showing a redundancy address setting operation performed by the memory circuit 1 in FIG. 1 with respect to defective data. An operation of setting a redundancy address with respect to defective data, which is performed subsequently to a normal reading operation if data read in the reading operation is defective, is described with reference to FIGS. 1 and 4. In the following, similarly to FIG. 3, to simplify the description, the case where a redundancy row address is set using the redundancy address latch circuit 12-1 is described.

In FIG. 4, firstly, at time t11, the high-level chip selection signal CS is inputted to the memory control circuit 10. The memory control circuit 10 generates a high-level reset signal RS and outputs the same to the redundancy address latch circuits 12-1 to 12-4. Thereupon, the redundancy address latch circuits 12-1 to 12-4 are reset, and the redundancy addresses P1 to P4 all become "00 . . . 0." After the reset by the reset signal RS, since none of the redundancy address latch circuits 12-1 to 12-4 is accessed, the redundancy address use flag signals RU1 to RU4 are all at a low level. That is, at time t11, all of the redundancy address latch circuits 12-1 to 12-4 are in an unusable state.

Next, at time t12, the chip selection signal CS is at a high level, the address Address including the row address Axa and the column address Aya is inputted to the memory circuit 1, and is latched on the rising edge of the clock signal CLK.

Next, at time t13, the memory control circuit 10 generates a high-level word driver activation signal XE and outputs the same to the word driver 7, and the word line WLa corresponding to the row address Axa latched at time t12 is selected. The selected word line WLa becomes high level, and data stored in a memory cell Cc is transmitted to the bit line pair BLc, BLc/ in the column section BBc. The transmitted data is amplified by the sense amplifier 95 connected to the bit line pair BLc, BLc/. Similarly to the memory cell Cc, a plurality of memory cells 50 connected to the word line WLa respectively transmit their stored data to the bit line pairs BL, BL/, and the transmitted data is amplified by the sense amplifier 95 connected to each of the bit line pairs BL, BL/.

Next, at time t14, the memory control circuit 10 generates a high-level Y-decoder activation signal YE and outputs the same to the Y-decoder 9. Since the column address Aya is latched at time t13, the Y-decoder section 9-*n* corresponding to the column address Aya transmits the data amplified by the sense amplifier 95 to the data bus Dbus in response to the high-level Y-decoder activation signal YE at time t14.

Next, at the rise of the clock signal CLK at time t15, the data transmitted to the data bus Dbus is read as the data DQ through the data buffer 8. If the read data DQ is erroneous and the memory cell Cc is defective, it is desired that the word line WLa connected to the memory cell Cc be replaced with the redundancy word lines RWL1 and RWL2. Whether or not the read data DQ is erroneous can be determined by, e.g., the memory tester 2. For example, the memory tester 2 detects a defect of the data DQ read from the memory cell Cc at time t15, generates a high-level redundancy address write enable signal RAL1 and outputs the same to the redundancy address latch circuit 12-1 of the memory circuit 1. Thereupon, the redundancy address latch circuit 12-1 latches the row address Axa at time t16.

As described above, in the memory circuit 1 according to the present embodiment, when a defective memory cell is detected, replacement of the defective part by means of a redundancy memory cell can be performed from the subsequent cycle without a need to turn off the power. During a power-up from the subsequent cycle, the redundancy word line RWL1 is replaced with the selected word line WL1, and the redundancy memory cell RCc operates in place of, e.g., the memory cell Cc. Moreover, by setting the redundancy address write enable signal RAL2 in place of the redundancy address write enable signal RAL1 to a high level, the redundancy word line RWL2 can also be used in place of the redundancy word line RWL1. In addition, similarly to the redundancy address write enable signals RAL1 and RAL2, by use of the redundancy address write enable signals RAL3 and RAL4, replacement of a bit line with a redundancy bit line is also possible without a need to turn on the power again. At this moment, redundancy memory cells RCd and RC11 connected to the redundancy bit line pair RBL1, RBL1/ operate in place of e.g., the memory cell Cc.

According to the memory circuit 1 configured as above, the plurality of memory cells 50, the memory control circuit 10, the redundancy decoders 13-1 to 13-4, and the redundancy address latch circuits 12-1 to 12-4 are included. The plurality of memory cells 50 are respectively connected to a plurality of word lines WL and bit lines BL intersecting each other and store data inputted from the bit lines BL. Based on the address Address including the row address Ax designating each of the word lines WL and the column address Ay designating each of the bit lines BL, the memory control circuit 10 controls an operation of reading the stored data from the memory cell 50 connected to the word line WL and the bit line BL designated by the row address Ax and the column address Ay. When the address Address includes the redundancy addresses P1 to P4 designating the word line WLa or the bit line BLc connected to a specific memory cell Cc, the redundancy decoders 13-1 to 13-4 replace the specific memory cell Cc with the redundancy memory cell RCc connected to the predetermined redundancy word lines RWL1 and RWL2 or redundancy bit lines RBL1 and RBL2 in the plurality of memory cells 50. The redundancy address latch circuits 12-1 to 12-4 respectively hold the redundancy addresses P1 to P4, and erase the held redundancy addresses P1 to P4 based on the reset signal RS inputted from the memory control circuit 10.

Due to the reset signal RS in the memory circuit 1, during storage and reading of the data, the memory control circuit 10 is capable of resetting the redundancy address latch circuits 12-1 to 12-4 so as to reset a redundancy address. Thus, a test for repair for a memory cell can be carried out with high efficiency.

In addition, according to the memory circuit 1, the redundancy address latch circuits 12-1 to 12-4 respectively hold the redundancy addresses P1 to P4 based on the separately inputted redundancy address write enable signals RAL1 to RAL4. According to the redundancy address write enable signals RAL1 to RAL4, the redundancy addresses P1 to P4 can be respectively set to the redundancy address latch circuits 12-1 to 12-4 at separate timings. Thus, the convenience in testing can be further improved.

The memory circuit 1 may also be configured as a memory macro in, e.g., a portion of a region on a chip in an ASIC or an SOC. During a development phase of a memory macro or a memory macro test chip, it is unreasonable, in view of development costs and development period, to perform development so as to support all forms such as various fuse elements separately arranged for the redundancy repair function of the memory macro or alternatives configured without using any fuse element, etc. However, in the prior art, if any fuse element is not set, a test evaluation of the redundancy repair function in the memory macro cannot be carried out. In contrast, according to the memory circuit 1 according to the present embodiment, a memory macro generally applicable to various fuse elements for the redundancy repair function or alternatives to the fuse elements may be provided.

In addition, according to the memory circuit 1, in the use as a memory macro test chip, since the setting of the redundancy row or the redundancy column can be freely selected from an external memory tester or a built-in self-test (BIST) circuit and so on, the development of the test chip can be facilitated. Particularly, for memory producers, it is useful for testing a memory under development and evaluating whether the production volume can be increased by selecting the setting of either the redundancy row or the redundancy column. In addition, since the set redundancy address can be reset by the reset signal RS, a user can set the redundancy address many times, an inspection of the redundancy repair function in all combinations can be performed, and the convenience in various tests such as wafer tests or functionality tests of a memory can be improved.

Embodiment 2

Figure 5:
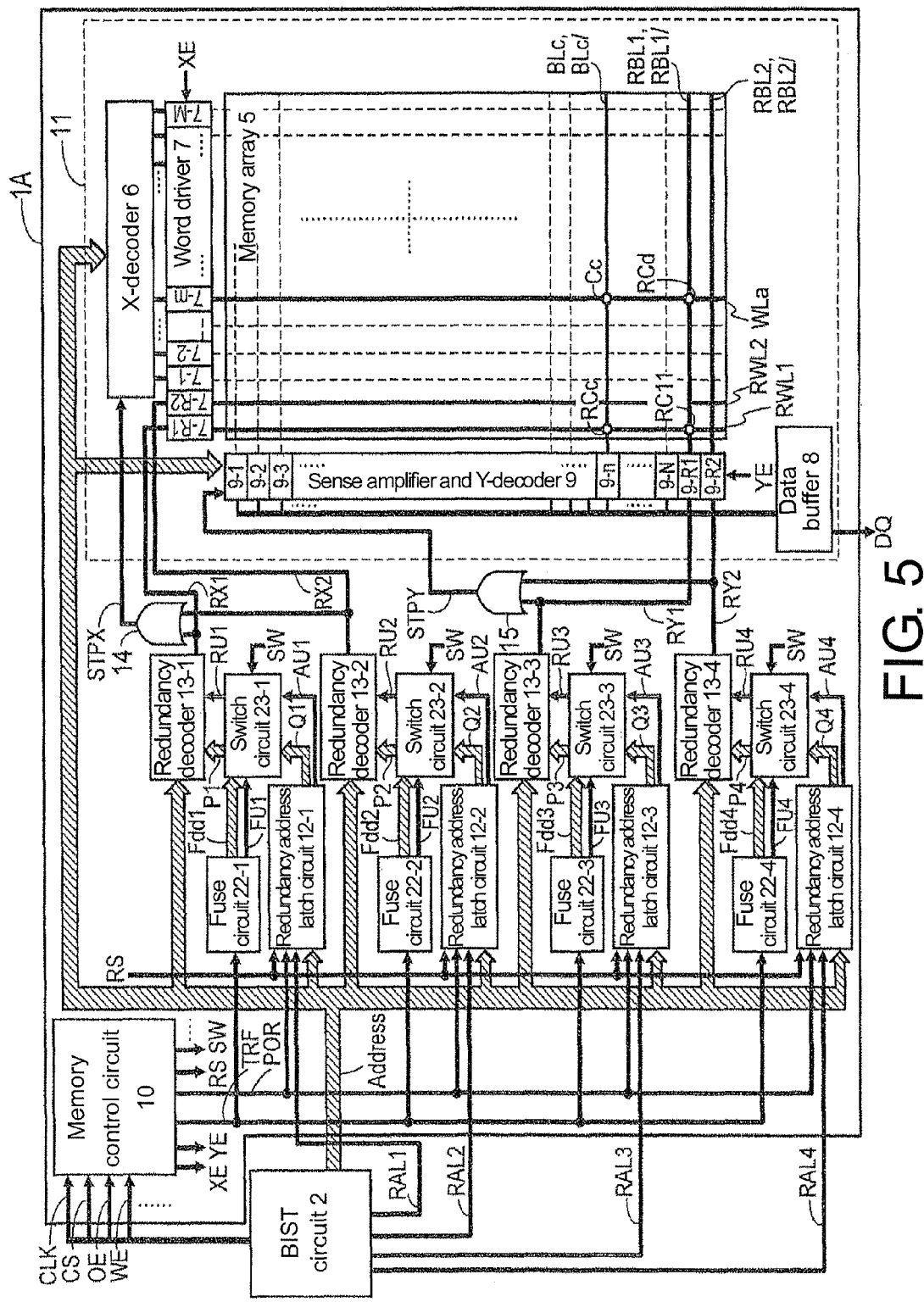
FIG. 5 is a block diagram showing a structure of a semiconductor integrated circuit apparatus according to Embodiment 2 of the invention.

FIG. 5 is a block diagram showing a structure of a semiconductor integrated circuit apparatus according to Embodiment 2 of the invention. The semiconductor integrated circuit apparatus according to Embodiment 2 includes a memory circuit 1A and a BIST circuit 2A. Compared to the memory circuit 1 according to Embodiment 1, the memory circuit 1A according to Embodiment 2 is characterized by further including: fuse circuits 22-1 to 22-4, storing a redundancy address in a non-volatile manner; and switch circuits 23-1 to 23-4, selectively switching to a volatile redundancy address or a non-volatile redundancy address. This difference is described below.

In FIG. 5, the semiconductor integrated circuit apparatus includes, e.g., a semiconductor chip such as an SOC or an ASIC. The BIST circuit 2A is arranged in a region different from the region where the memory circuit 1A is arranged in, e.g., an SOC, and generates various signals and outputs the same to the memory circuit 1A, similarly to the memory tester 2 in FIG. 1. Based on a control signal TRF from the memory control circuit 10, the fuse circuits 22-1 to 22-4 generate fuse addresses Fdd1 to Fdd4 indicating a redundancy address stored in a non-volatile manner and fuse use flag signals FU1 to FU4 indicating whether or not the redundancy address is stored, and output the same to the switch circuits 23-1 to 23-4. On the other hand, the redundancy address latch circuits 12-1 to 12-4 respectively output redundancy addresses Q1 to Q4 and redundancy address use flag signals AU1 to AU4 to the switch circuits 23-1 to 23-4.

Based on a switch signal SW from the memory control circuit 10, the switch circuits 23-1 to 23-4 respectively selectively switch to a combination of the fuse addresses Fdd1 to Fdd4 and the fuse use flag signals FU1 to FU4, or a combination of the redundancy addresses Q1 to Q4 and the redundancy address use flag signals AU1 to AU4. The selected combination of signals is outputted respectively as the redundancy addresses P1 to P4 and the redundancy address use flag signals RU1 to RU4 to the redundancy decoders 13-1 to 13-4.

In the memory circuit 1A according to Embodiment 2, while an advantage of the memory circuit 1 according to Embodiment 1 in terms of convenience in development evaluation is maintained, an advantage of non-volatile fuse circuits can be incorporated. Here, in common fuse circuits, laser fuse has an advantage of being extensively used and easily replaced with a redundancy memory cell. However, these fuse circuits are non-volatile, and once a redundancy fuse is cut off, a corresponding redundancy memory cell cannot be used for another defective memory cell. In addition, the fuse circuits cannot be used after package encapsulation. Even if there is an unused redundancy memory cell on the chip, the repair for a defective memory cell cannot be performed after package encapsulation.

On the other hand, antifuse has an advantage of being usable after package encapsulation. For example, for SOC vendors considering using SRAM macros or DRAM macros, the antifuse has a great advantage of capability to perform the redundancy repair after package encapsulation. However, after package encapsulation, without a cutting machine especially made for antifuses or an expensive memory tester capable of cutting antifuses, the antifuse cannot be cut off. Generally, an SOC is an expensive chip, and it is unacceptable that the SOC cannot become a product only because of a defective memory cell.

In addition, currently, antifuse is an immature technology compared to laser fuse, and is questionable in terms of reliability. For example, whether or not the antifuse is cut off must be determined by a special test. In addition, an additional test period becomes necessary. Currently, only a minority of semiconductor providers use antifuses on memories. In addition, the antifuse requires a huge circuit area for including fuse elements, control circuits and excess voltage generation circuits. In view of the above issues, the memory circuit 1A according to the present embodiment is characterized by having the advantage of non-volatile fuse circuits and being capable of solving the issues by the redundancy address latch circuits 12-1 to 12-4.

Figure 6:
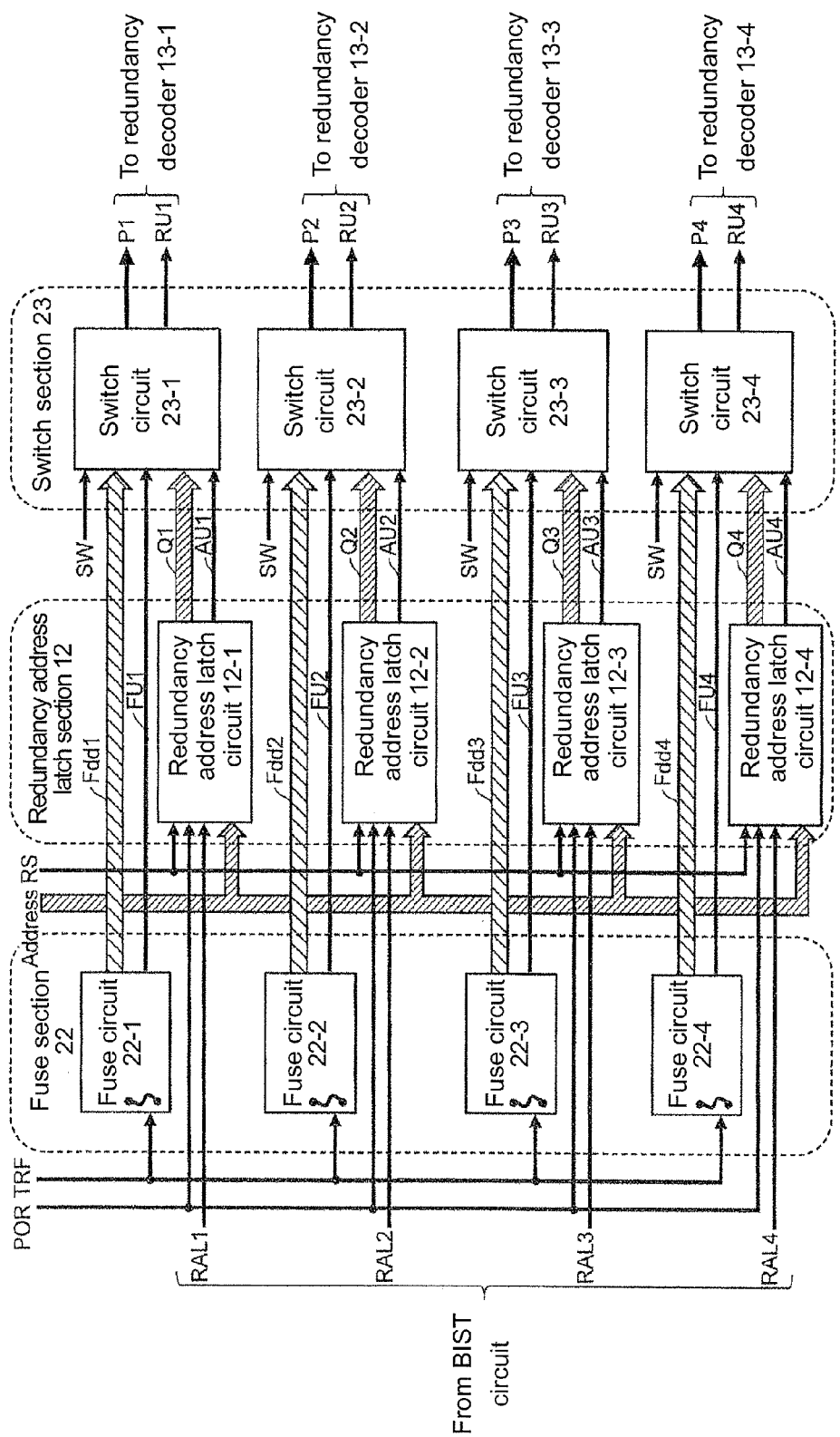
FIG. 6 is a block diagram showing a structure of a fuse section 22, a redundancy address latch section 12 and a switch section 23 in a memory circuit 1A in FIG. 5.

FIG. 6 is a block diagram showing a structure of the fuse section 22, the redundancy address latch section 12 and the switch section 23 in the memory circuit 1A in FIG. 5. In FIG. 6, the fuse section 22 includes the fuse circuits 22-1 to 22-4, the redundancy address latch section 12 includes the redundancy address latch circuits 12-1 to 12-4, and the switch section 23 includes switch circuits 23-1 to 23-4. In the following, an example of a specific circuit structure of the fuse section 22, the redundancy address latch section 12 and the switch section 23 is described with reference to FIGS. 7 to 9 respectively.

Figure 7:
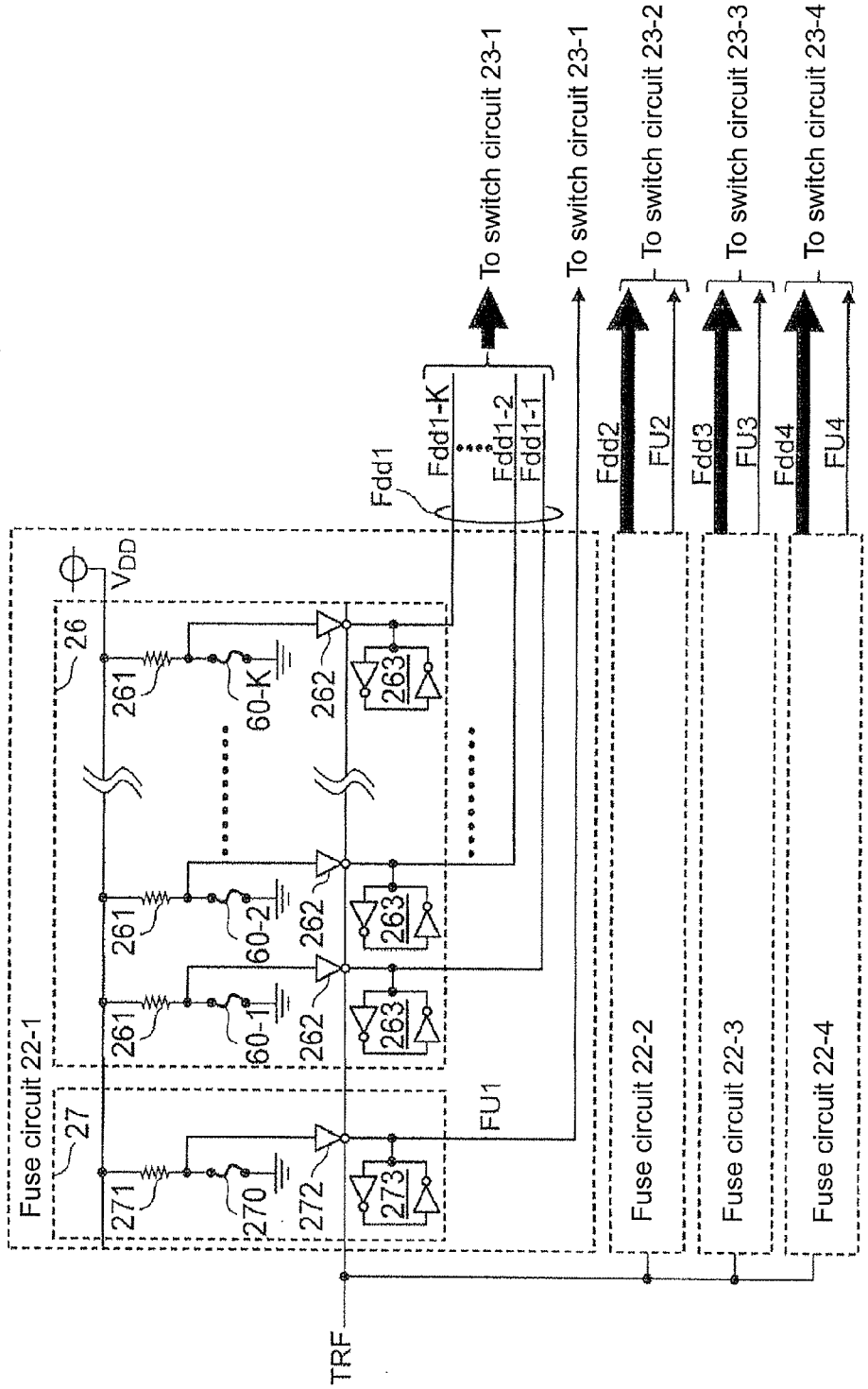
FIG. 7 is a circuit diagram showing a structure of the fuse section 22 in FIG. 6.

FIG. 7 is a circuit diagram showing the structure of the fuse section 22 in FIG. 6. In FIG. 7, the fuse circuit 22-1 is configured by including a fuse address holding circuit 26 and a fuse use flag holding circuit 27. The fuse use flag holding circuit 27 includes a fuse 270, a resistor 271, a tristate inverter 272, and a latch circuit 273 including a pair of inverters connected to each other. The fuse address holding circuit 26 includes a plurality of fuses 60-$k$ ($k$=1, 2, . . . , K), a plurality of resistors 261 connected to the fuses 60-1 to 60-K, a plurality of tristate inverters 262, and a plurality of latch circuits 263 including an inverter pair. The fuse circuits 22-2 to 22-4 are configured in the same manner as the fuse circuit 22-1.

In the fuse use flag holding circuit 27 of the fuse circuit 22-1, the fuse 270 includes, e.g., a physical fuse element such as a metal wire and a polywire, etc., and is cut off in order to indicate that the fuse circuit 22-1 has been used. A power voltage VDD is supplied through the resistor 271 to the fuse 270 to be grounded. A voltage between the fuse 270 and the resistor 271 is inputted to the tristate inverter 272, and changes from low level to high level due to the cut-off of the fuse 270.

The memory control circuit 10 shown in FIG. 5 generates a high-level control signal TRF during, e.g., transmission of fuse data indicating the cut-off of the fuse 270, so that an input signal is inverted at the tristate inverter 272, and an inversion signal from the tristate inverter 272 is held by the latch circuit 273. The memory control circuit 10 controls an output terminal of the tristate inverter 272 in a high impedance state according to a low-level control signal TRF, and the latch circuit 273 outputs its held signal as the fuse use flag signal FU1 to the switch circuit 23-1.

In the fuse address holding circuit 26 of the fuse circuit 22-1, the fuses 60-1 to 60-K each include, e.g., a physical fuse element such as a metal wire and a polywire, etc., and are respectively cut off in order to store a specific redundancy address in a non-volatile manner. Fuse addresses Fdd1-1 to Fdd1-K stored in a non-volatile manner due to the cut-off of the fuses 60-1 to 60-K are respectively held by a plurality of latch circuits 263 based on the control signal TRF and outputted as a fuse address Fdd to the switch circuit 23-1, similarly to the fuse use flag signal FU1. Moreover, the fuse circuits 22-1 to 22-4 may also be configured by including, in place of the fuse element such as a metal wire and a polywire, etc., an antifuse or an OTP cell, and a flash memory.

Figure 8:
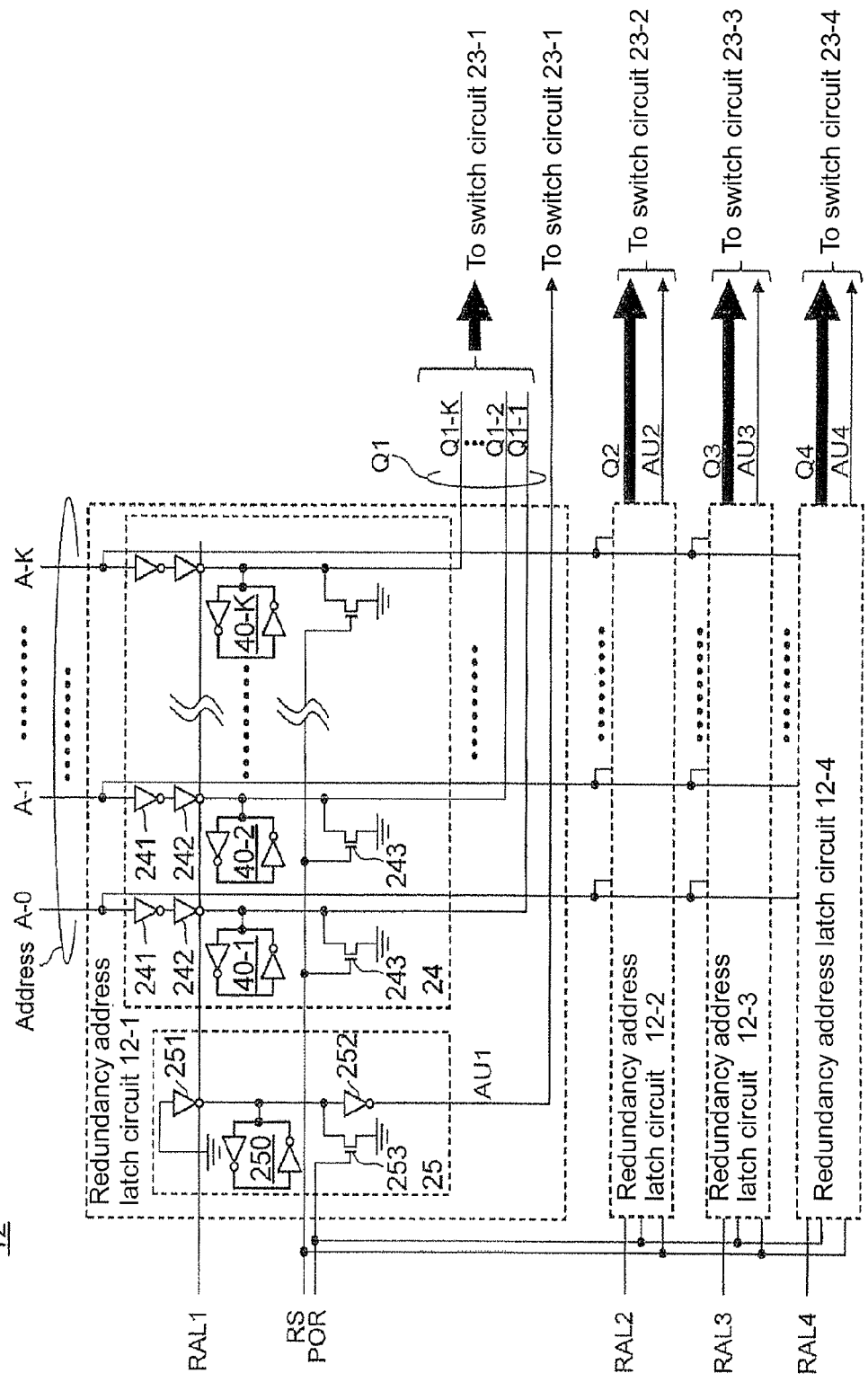
FIG. 8 is a circuit diagram showing a structure of the redundancy address latch section 12 in FIG. 6.

FIG. 8 is a circuit diagram showing the structure of the redundancy address latch section 12 in FIG. 6. In FIG. 8, the redundancy address latch circuit 12-1 is configured by including a redundancy address holding circuit 24 and a redundancy address use flag holding circuit 25. The redundancy address use flag holding circuit 25 includes a latch circuit 250 including an inverter pair, a tristate inverter 251, an inverter 252 and a transfer gate 253. The redundancy address holding circuit 24 includes a plurality of latch circuits 40-1 to 40-K including an inverter pair, a plurality of inverters 241 connected to the latch circuits 40-1 to 40-K, a tristate inverter 242 and a transfer gate 243. The redundancy address latch circuits 12-2 to 12-4 are configured in the same manner as the redundancy address latch circuit 12-1.

In the redundancy address use flag holding circuit 25 of the redundancy address latch circuit 12-1, the connected tristate inverter 251 inverts an input signal if the redundancy address write enable signal RAL1 is at a high level, and an output terminal of the connected tristate inverter 251 is changed to a high resistance state if the redundancy address write enable signal RAL1 is at a low level. When the redundancy address write enable signal RAL1 is at a high level, the latch circuit 250 captures and holds an inversion signal from the tristate inverter 251. A power signal POR becomes high level at power-on, switching on the transfer gate 253 so as to reset the latch circuit 250. The signal held by the latch circuit 250 is outputted as the redundancy address use flag signal AU1 through the inverter 252 to the switch circuit 23-1.

In the redundancy address holding circuit 24 of the redundancy address latch circuit 12-1, address bit signals A-1 to A-K, examply, indicating bits of a row address in the address Address are respectively inputted through the inverter 241 to the tristate inverter 242. Each tristate inverter 242 inverts the input signal if the redundancy address write enable signal RAL1 is at a high level, and an output terminal of the tristate inverter 242 is changed to a high resistance state if the redundancy address write enable signal RAL1 is at a low level. When the redundancy address write enable signal RAL1 is at a high level, the latch circuits 40-1 to 40-K each capture an inversion signal from the tristate inverter 242 and hold the same respectively as redundancy address bit signals Q1-1 to Q1-K. The reset signal RS switches on the transfer gate 243 so as to reset the latch circuits 40-1 to 40-K. The redundancy address bit signals Q1-1 to Q1-K are outputted as a redundancy address Q1 to the switch circuit 23-1.

Figure 9:
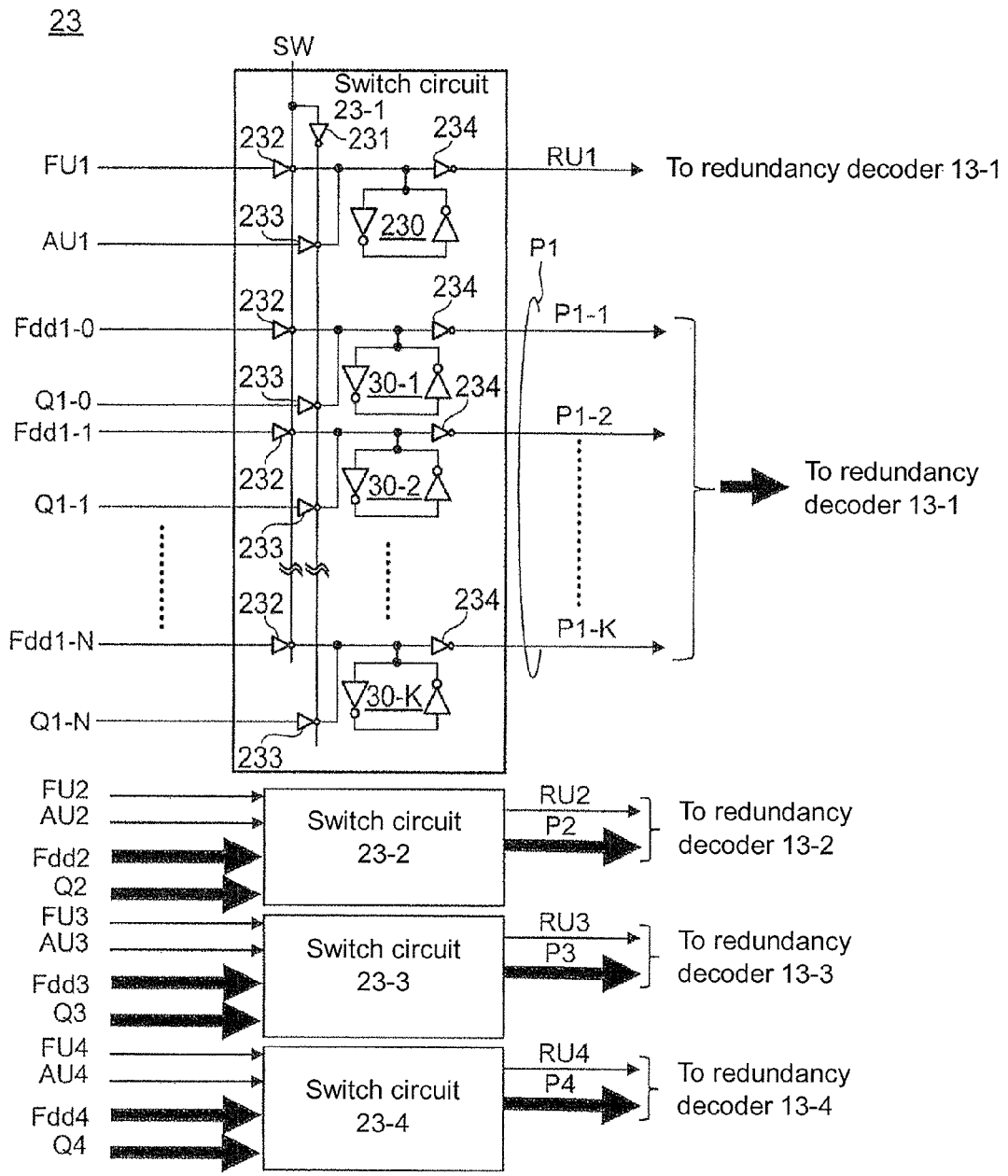
FIG. 9 is a circuit diagram showing a structure of the switch section 23 in FIG. 6.

FIG. 9 is a circuit diagram showing the structure of the switch section 23 in FIG. 6. In FIG. 9, the switch circuit 23-1 includes an inverter 231, a plurality of tristate inverters 232 and 233, a plurality of latch circuits 230 and 30-1 to 30-K including an inverter pair, and a plurality of inverters 234. The switch circuits 23-2 to 23-4 are configured in the same manner as the switch circuit 23-1.

In the switch circuit 23-1, if the switch signal SW is at a high level, the tristate inverter 232 is activated while the tristate inverter 233 is deactivated, and the latch circuits 230 and 30-1 to 30-K respectively capture and hold the fuse use flag signal FU1 and the fuse addresses Fdd1-1 to Fdd1-K from the fuse circuit 22-1. On the other hand, if the switch signal SW is at a low level, the tristate inverter 233 is activated while the tristate inverter 232 is deactivated, and the latch circuits 230 and 30-1 to 30-K respectively capture and hold the redundancy address use flag signal AU1 and the redundancy address bit signals Q1-1 to Q1-K from the redundancy address latch circuit 12-1. The latch circuits 230 and 30-1 to 30-K respectively output their held signals as the redundancy address use flag signal RU1 and redundancy address bit signals P1-1 to P1-K through the inverter 234 to the redundancy decoder 13-1.

In the following, an operation of selectively switching to a volatile redundancy address or a non-volatile redundancy address in the memory circuit 1A configured as above is described.

Figure 10:
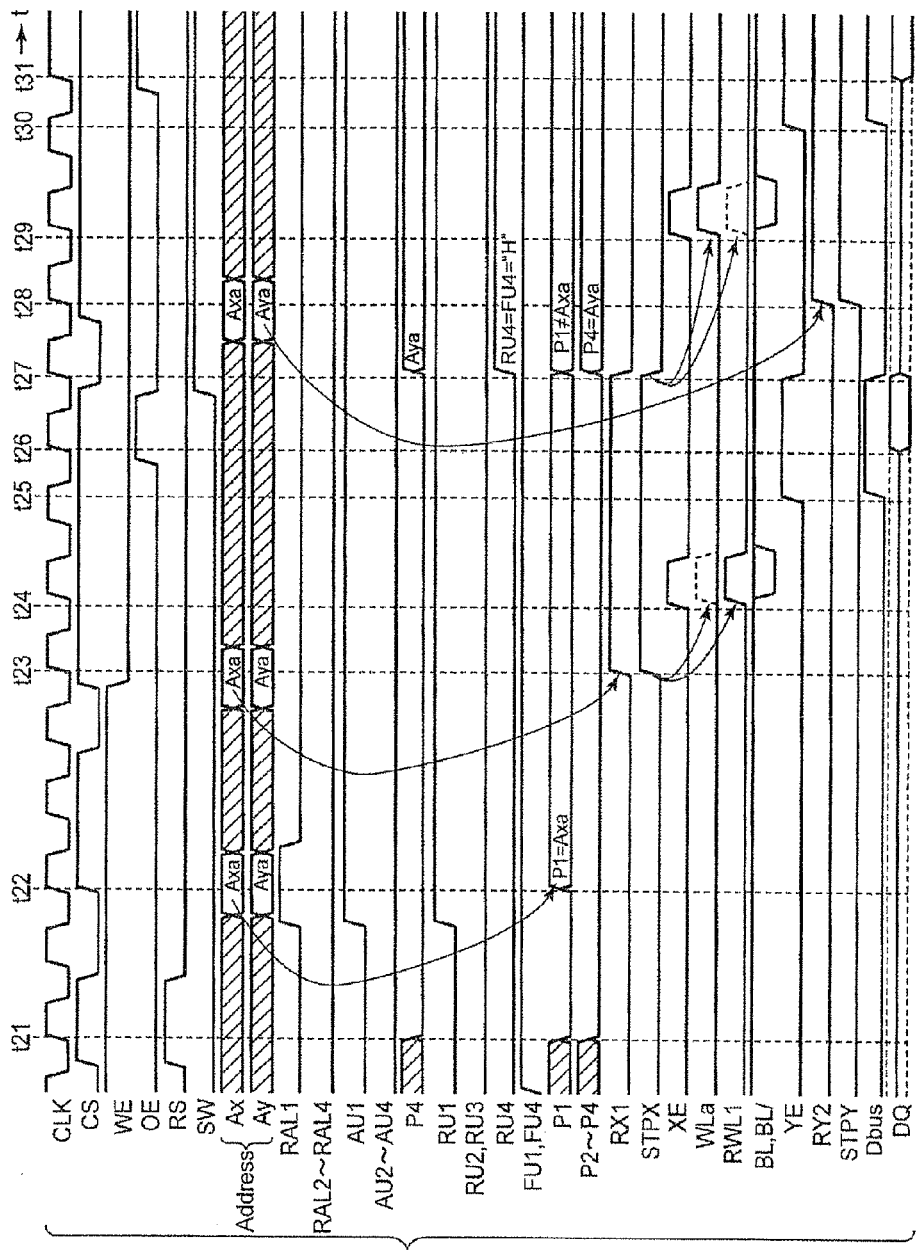
FIG. 10 is a timing chart of signals showing a switching operation of the redundancy address latch section 12 and the fuse section 22 in the memory circuit 1A in FIG. 5.

FIG. 10 is a timing chart of signals showing a switching operation of the redundancy address latch section 12 and the fuse section 22 in the memory circuit 1A in FIG. 5. Before the switching operation shown in FIG. 10 starts, a row address different from the row address Axa has been stored in advance in the fuse circuit 22-1, and the column address Ays has been stored in advance in the fuse circuit 22-4.

In FIG. 10, firstly, at time t21, the chip selection signal CS becomes high level. The memory control circuit 10 generates a high-level reset signal RS and outputs the same to the redundancy address latch circuits 12-1 to 12-4. Thereupon, the redundancy address latch circuits 12-1 to 12-4 are reset, and the redundancy addresses Q1 to Q4 all become "00 . . . 0." On the other hand, the redundancy address use flag signals AU1 to AU4 are reset at power-on and become low level. In addition, at time t21, the memory control circuit 10 generates a low-level switch signal SW1 and outputs the same to the switch circuits 23-1 to 23-4. Hence, the redundancy addresses Q1 to Q4 become the redundancy addresses P1 to P4, and the redundancy address use flag signals AU1 to AU4 become the redundancy address use flag signals RU1 to RU4.

Next, at time t22, the address Address including the row address Axa and the column address Aya and the high-level redundancy address write enable signal RAL1 are inputted to the memory circuit 1A. Since the redundancy address write enable signals RAL2 to RAL4 are at a low level, only the row address Axa is latched by the redundancy address latch circuit 12-1 on the rising edge of the clock signal CLK. Thereupon, the redundancy address latch circuit 12-1 generates a high-level redundancy address use flag signal AU1 and outputs the same as the redundancy address use flag signal RU1 through the switch circuit 23-1 to the redundancy decoder 13-1. Thereby, the redundancy decoder 13-1 is activated. On the other hand, the redundancy address use flag signals RU2 to RU4 are maintained at a low level, and the redundancy decoders 13-2 to 13-4 are not activated. After the reset by the reset signal RS, as long as the redundancy address latch circuits 12-1 to 12-4 are not selected by the redundancy address write enable signals RAL1 to RAL4, the redundancy decoders 13-1 to 13-4 are not used.

Next, at time t23, the chip selection signal CS becomes high level, and the address Address is inputted to the memory circuit 1A on the rising edge of the clock signal CLK. Since the redundancy address P1 matches the row address Axa in the inputted address Address, the redundancy decoder 13-1 generates and outputs a high-level redundancy use determination signal RX1. Accordingly, the X-decoder deactivation signal STPX becomes high level, and the X-decoder 6 stops its operation.

Next, at time t24, the memory control circuit 10 outputs the high-level word driver activation signal XE to the word driver 7, and the word driver 7 selects the redundancy word line RWL1. The data stored in the redundancy memory cell RCc connected to the selected redundancy word line RWL1 is transmitted to the bit line pair BLc, BLc/ in the column section BBc, and is amplified by the sense amplifier 95 connected to the bit line pair BLc, BLc/ (see FIG. 2). Similarly to the redundancy memory cell RCc, a plurality of memory cells 50 connected to the redundancy word line RWL1 respectively transmit their stored data to the bit line pairs BL, BL/, and the transmitted data is amplified by the sense amplifier 95 connected to each of the bit line pairs BL, BL/. On the other hand, although the row address Axa is inputted, the word line WLa is not selected due to the stop of the X-decoder 6 caused by the X-decoder deactivation signal STPX.

Next, at time t25, the memory control circuit 10 outputs the high-level Y-decoder activation signal YE to the Y-decoder 9. In this case, no redundancy column is in use. Thus, as a normal column function, in response to the high-level Y-decoder activation signal YE at time t29, the Y-decoder section 9-$n$ corresponding to the column address Aya inputted at time t23 transmits the data amplified by the sense amplifier 95 to the data bus Dbus. At the rise of the clock signal CLK at time t30, the data transmitted to the data bus Dbus is outputted as the data DQ through the data buffer 8.

Next, at time t26, the memory control circuit 10 generates a high-level switch signal SW1 and outputs the same to the switch circuits 23-1 to 23-4. The switch circuits 23-1 to 23-4 switch from the redundancy address latch circuits 12-1 to 12-4 to the fuse circuits 22-1 to 22-4 and are connected to the redundancy decoders 13-1 to 13-4. Hence, the redundancy addresses P1 to P4 are switched from the redundancy addresses Q1 to Q4 to the fuse addresses Fdd1 to Fdd4, and the redundancy address use flag signals RU1 to RU4 are switched from the redundancy address use flag signals AU1 to AU4 to the fuse use flag signals FU1 to FU4.

Due to the switching operation at time t27, the redundancy address P4 becomes a value of the fuse address Fdd4 set by cutting off a fuse of the fuse circuit 22-4, namely, the column address Aya. In addition, the redundancy address use flag signal RU4 changes from low level to high level. The redundancy address P1 becomes a value of the fuse address Fdd1 set by cutting off a fuse of the fuse circuit 22-1, and does not become the row address Axa.

Next, at time t28, the chip selection signal CS becomes high level, and the address Address including the row address Axa and the column address Aya is inputted to the memory circuit 1A on the rising edge of the clock signal CLK. Since the column address Aya in the inputted address Address matches the redundancy address P4, i.e., the fuse address Fdd4, the redundancy decoder 13-4 generates and outputs a high-level redundancy use determination signal RY2. Accordingly, the Y-decoder deactivation signal STPY becomes high level, and the Y-decoder 9 stops its operation.

Next, at time t29, the switch signal SW is at a high level, and the row address Axa is not designated to any of the fuse circuits 22-1 to 22-4. Therefore, in response to the high-level word driver activation signal XE, the word driver 7 selects a normal word line WLa corresponding to the row address Axa. The selected word line RWLa becomes high level, and data stored in the memory cell Cc in the column section BBc corresponding to the column address Aya is transmitted to the bit line pair BLc, BLc/. Similarly to the memory cell Cc, data stored in the memory cell RCd connected to the word line WLa in a column section RBB1 is also transmitted to the redundancy bit line pair RBL1, RBL1/.

In this case, the switch signal SW is at a high level and the redundancy use determination signal RY2 is at a high level. Therefore, the redundancy Y-decoder section 9-R2 is activated and data in a column section RBB2 is selected. At time t30, in response to the high-level Y-decoder activation signal YE, the redundancy Y-decoder section 9-R2 amplifies the data from the bit line pair BLc, BLc/ and transmits the same to the data bus Dbus. At the rise of the clock signal CLK at time t31, the data transmitted to the data bus Dbus is outputted as the data DQ through the data buffer 8.

According to the memory circuit 1A configured as above, the fuse circuits 22-1 to 22-4 and the switch circuits 23-1 to 23-4 are further provided. The fuse circuits 22-1 to 22-4 include the fuses 60-1 to 60-K for storing a redundancy address in a non-volatile manner. The fuse circuits 22-1 to 22-4 selectively switch between the redundancy addresses Q1 to Q4 held by the redundancy address latch circuits 12-1 to 12-4 and the fuse addresses Fdd1 to Fdd4 stored in the fuse circuits 22-1 to 22-4, and output the same to the redundancy decoders 13-1 to 13-4. When the address Address includes the redundancy addresses P1 to P4 from the switch circuits 23-1 to 23-4, the redundancy decoders 13-1 to 13-4 replace the specific memory cell Cc with the redundancy memory cell RCc to operate.

According to the memory circuit 1A, it is possible for SOC providers having the BIST and memory macro in the SOC to easily repair a defective chip without using an antifuse. For example, if it is required to use the SOC under a voltage or temperature environment that meets or slightly exceeds specification limits, a defective cell may occur so that the use of the SOC must be abandoned. In this way, if a defective cell occurs, an SOC user itself is capable of performing a repair by replacing a defective part with a redundancy cell simply by switching the switch signal SW. According, an increase in manufacturing costs for the SOC can be prevented. Furthermore, after an address of the defective part is ascertained, the SOC user causes a flash memory or the like on the SOC to store the redundancy address, thereby capturing the redundancy address to the memory circuit 1A after power-on of the SOC.

In addition, according to the memory circuit 1A, for an antifuse user, several advantages are provided. First of all, generally, most SOC providers do not have a machine especially made for cutting antifuses, and it is actually impossible for common SOC customers to cut off an antifuse. Therefore, the same advantage as above also applies to the antifuse user.

In addition, during a defect detection for a memory cell, detection of a defective part caused by a margin of a circuit is not easy, and a long test period may be required. There are not only various tests requiring complicated test patterns. Many tests to be carried out by changing various parameters such as internal voltage or power supply voltage, temperature, etc. are also required. As mentioned above, the antifuse basically requires a longer test period than that for a common fuse. However, if the antifuse is used as an SOC, such a long period of time cannot be spent on a memory test.

In contrast, if the memory circuit 1A is applied to an SOC having a flash memory on a chip, a defect caused by the margin can be replaced by a redundancy address latch circuit after package encapsulation. In this case, a failure derived from a manufacturing process, which accounts for a higher percentage of defects, is replaced in advance by an antifuse before shipping to the SOC provider. Accordingly, testing costs of a memory provider and costs of the SOC provider can be considerably reduced.

Variant of Embodiment 2

Figure 11:
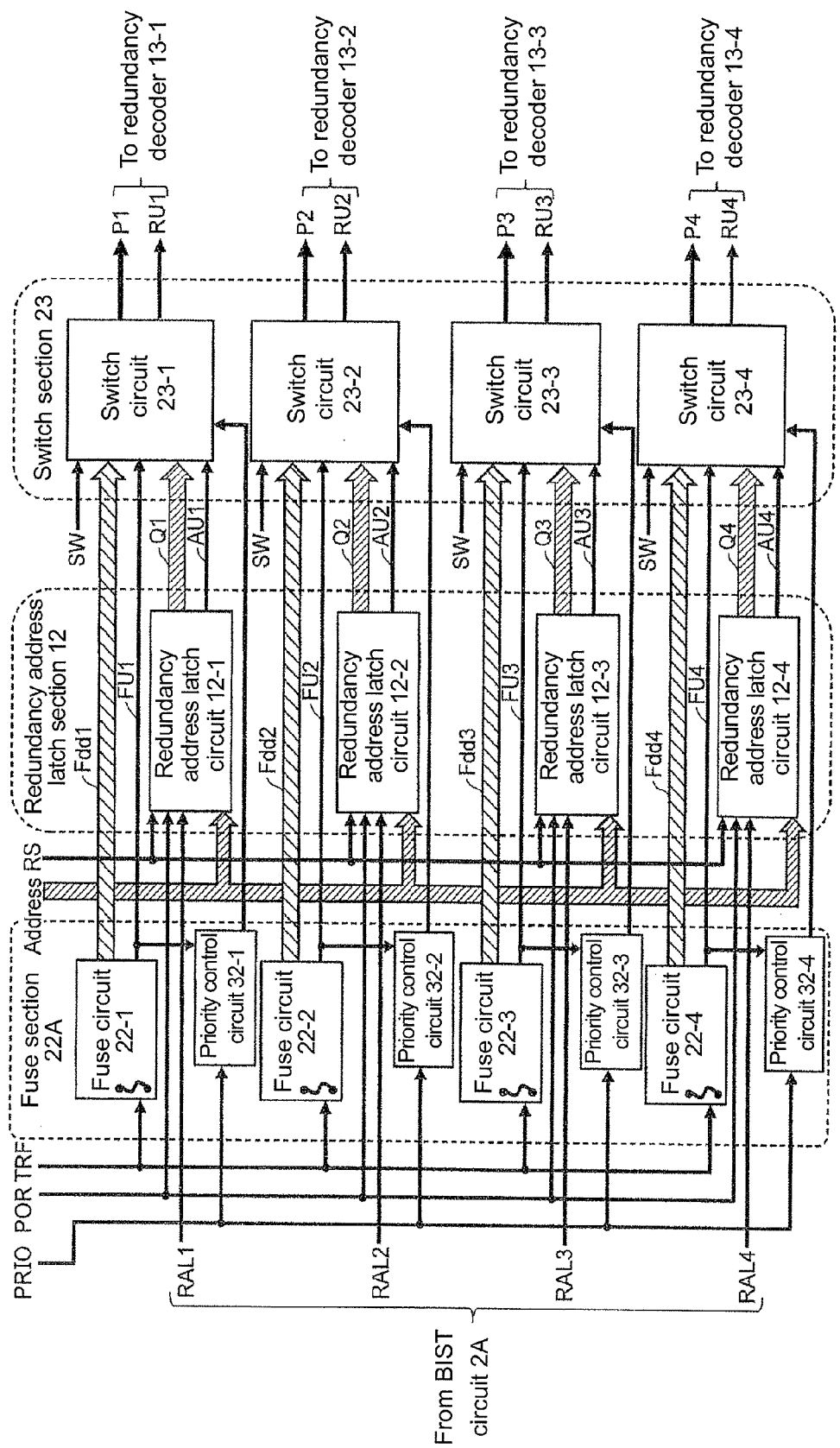
FIG. 11 is a block diagram showing a structure of a fuse section 22A, the redundancy address latch section 12 and the switch section 23 in a variant of Embodiment 2.

FIG. 11 is a block diagram showing a structure of a fuse section 22A, the redundancy address latch section 12 and the switch section 23 in a variant of Embodiment 2. In the variant of Embodiment 2, compared to Embodiment 2, priority control circuits 32-1 to 32-4 are further included. The priority control circuits 32-1 to 32-4 control the switch circuits 23-1 to 23-4 so that the redundancy address stored in a non-volatile manner in each of the fuse circuits 22-1 to 22-4 takes priority. This difference is described below.

In FIG. 11, the priority control circuits 32-1 to 32-4 are respectively activated based on a priority control activation signal PRIO from the memory control circuit 10, and determine whether or not the fuse use flag signals FU1 to FU4 are at a high level. If the priority control circuits 32-1 to 32-4 respectively determine that the fuse use flag signals FU1 to FU4 are at a high level, regardless of the switch signal SW, the priority control circuits 32-1 to 32-4 control the switch circuits 23-1 to 23-4 to select the combination of the fuse addresses Fdd1 to Fdd4 and the fuse use flag signals FU1 to FU4.

Due to the priority control circuits 32-1 to 32-4, even if the switch signal SW is at a low level, the redundancy address stored in the fuse circuits 22-1 to 22-4 is set to corresponding redundancy decoders. At this moment, if there is a fuse circuit among the fuse circuits 22-1 to 22-4 which has no redundancy address stored therein, a redundancy address held by the redundancy address latch circuit is set to the corresponding redundancy decoder. Hence, after a defective part is once detected and a redundancy address is set to a fuse circuit, if another defective part is further detected and a redundancy address is to be written in a redundancy address latch circuit, a redundancy address stored in the fuse circuit and a redundancy address written in the redundancy address latch circuit can be used at the same time, and convenience in setting in the redundancy repair can be improved.

Embodiment 3

Figure 12:
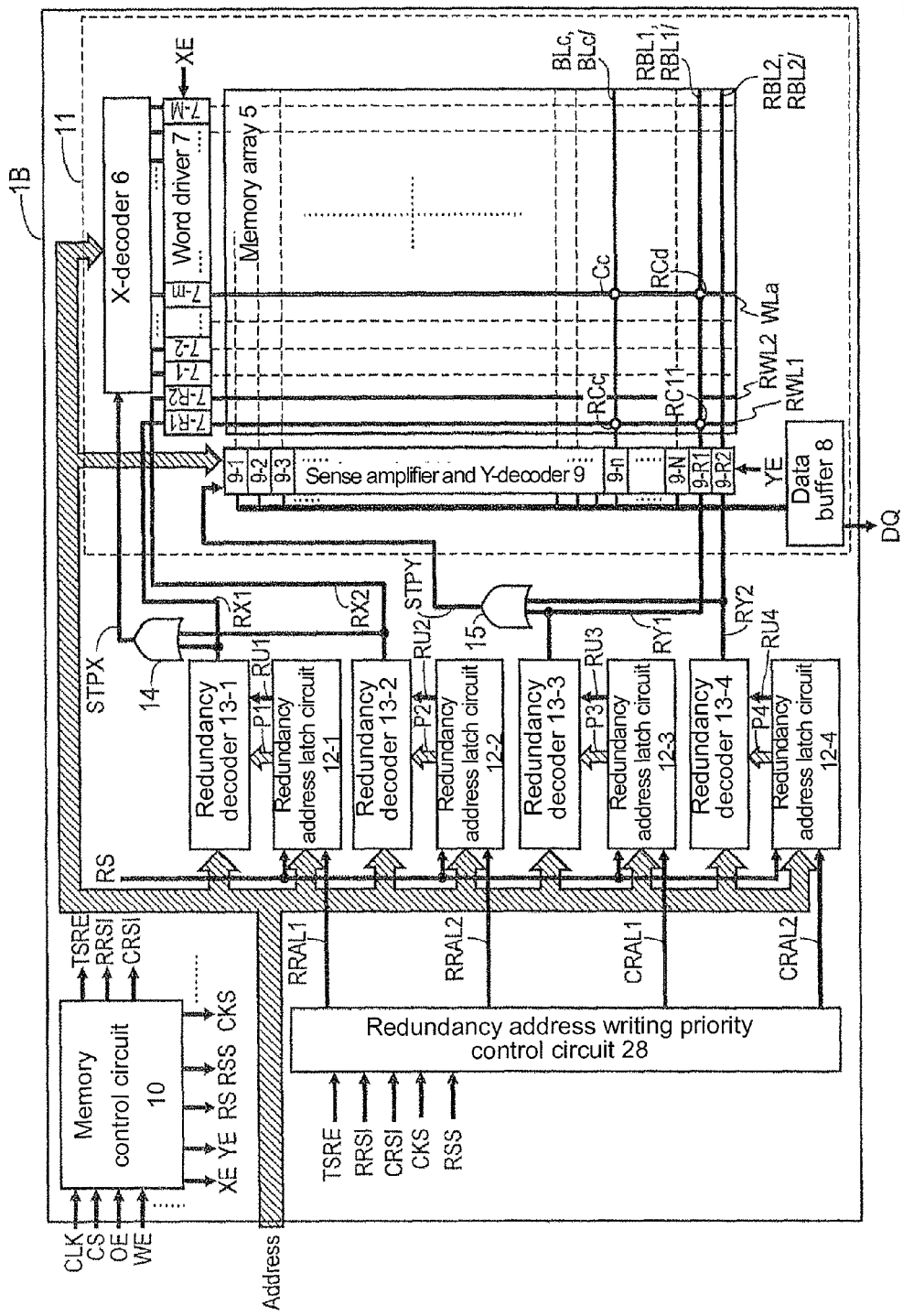
FIG. 12 is a block diagram showing a structure of a memory circuit 1B according to Embodiment 3 of the invention.

FIG. 12 is a block diagram showing a structure of a memory circuit 1B according to Embodiment 3 of the invention. Compared to the memory circuit 1 according to Embodiment 1, the memory circuit 1B according to Embodiment 3 is characterized by including: the redundancy address writing priority control circuit 28, giving priority to a redundancy row or a redundancy column so as to control the redundancy address latch circuits 12-1 to 12-4 to be writable sequentially. This difference is described below.

In FIG. 12, the redundancy address writing priority control circuit 28 is controlled by the memory control circuit 10 to generate redundancy address write enable signals RRAL1 and RRAL2 sequentially for writing a redundancy row address and output the same to the redundancy address latch circuits 12-1 and 12-2 respectively. Similarly, the redundancy address writing priority control circuit 28 generates redundancy address write enable signals CRAL1 and CRAL2 sequentially for writing a redundancy column address and outputs the same to the redundancy address latch circuits 12-3 and 12-4 respectively.

In general, defects of a memory cell include the following four types K1 to K4.

(K1): defects of a single memory cell distributed independently of adjacent memory cells;

(K2): row-related defects that a defective cell is found on a specific word line;

(K3): column-related defects that a defective cell is found on a specific bit line; and (K4): defects of a damaged region that a defective cell is found, which are concentrated in specific regions.

The defects of type K1 are caused by process variations of semiconductor, etc. There is usually a wide range of process variations. Statistically, a small number of cells have an extremely large margin, and most cells have a margin at a normal level. Cells having a small margin (hereinafter referred to as cells of a limit margin) are few, and several defective cells exist. Through various tests, the defective cells or the cells of a limit margin can be replaced with redundancy memory cells. However, actually, due to limitation on costs for testing, the few cells of a limit margin may be determined to be non-defective and may not be replaced with redundancy memory cells. In such case, the cells of a limit margin may gradually become defective cells.

The defects of type K2 are caused by problems of an X-decoder or a word line. For example, if a specific word line has an abnormal resistance, a high-level potential of the word line is lowered and a rise of the word line is delayed. In such case, data stored in a memory cell connected to a high-resistance word line cannot be accurately read, and relevant memory cells are determined to be defective cells. Here, as explained for the above type K1, memory cells having a good margin or memory cells of a limit margin exist even if connected to the high-resistance word line. During margin inspecting and manufacturing testing, these memory cells are determined to be non-defective.

The defects of type K3 are caused by sense amplifier-related problems. For example, if a transistor of a sense amplifier has unbalanced parameters or a contact in the sense amplifier has a high resistance, the sense amplifier does not function sufficiently well. As explained for the above types K1 and K2, memory cells having a good margin or memory cells of a limit margin exist even if connected to such a defective sense amplifier. During margin inspecting and manufacturing testing, these memory cells are determined to be non-defective.

The defects of type K4 are caused by problems in a manufacturing process or problems of original wafer materials. In the cases of types K1 to K3, a memory cell can be replaced by a redundancy memory cell. In the case of type K4, replacement can be performed by a redundancy memory cell. However, there are also cases where a region of a defective memory cell is larger so that replacement cannot be performed.

In type K1, a defective cell can be fully repaired by using any of a redundancy row and a redundancy column. However, in the case of type K2, a defective memory cell may become larger due to a defect of a word driver, as described in detail later. Thus, it is necessary to use a redundancy row so as to repair not only a defective cell but also a cell of a limit margin. Similarly, in the case of type K3, it is necessary to use a redundancy column so as to repair not only a defective cell but also a cell of a limit margin. According to Patent Document 2, in a redundancy repair by means of a BIST circuit, a redundancy scheme to repair a defective memory cell by either of a redundancy row and a redundancy column may be fixed. In the prior art, once a redundancy scheme is selected, the redundancy scheme cannot be changed in accordance with a type of defect corresponding to a specific process in a manufacturing process.

Figure 27:
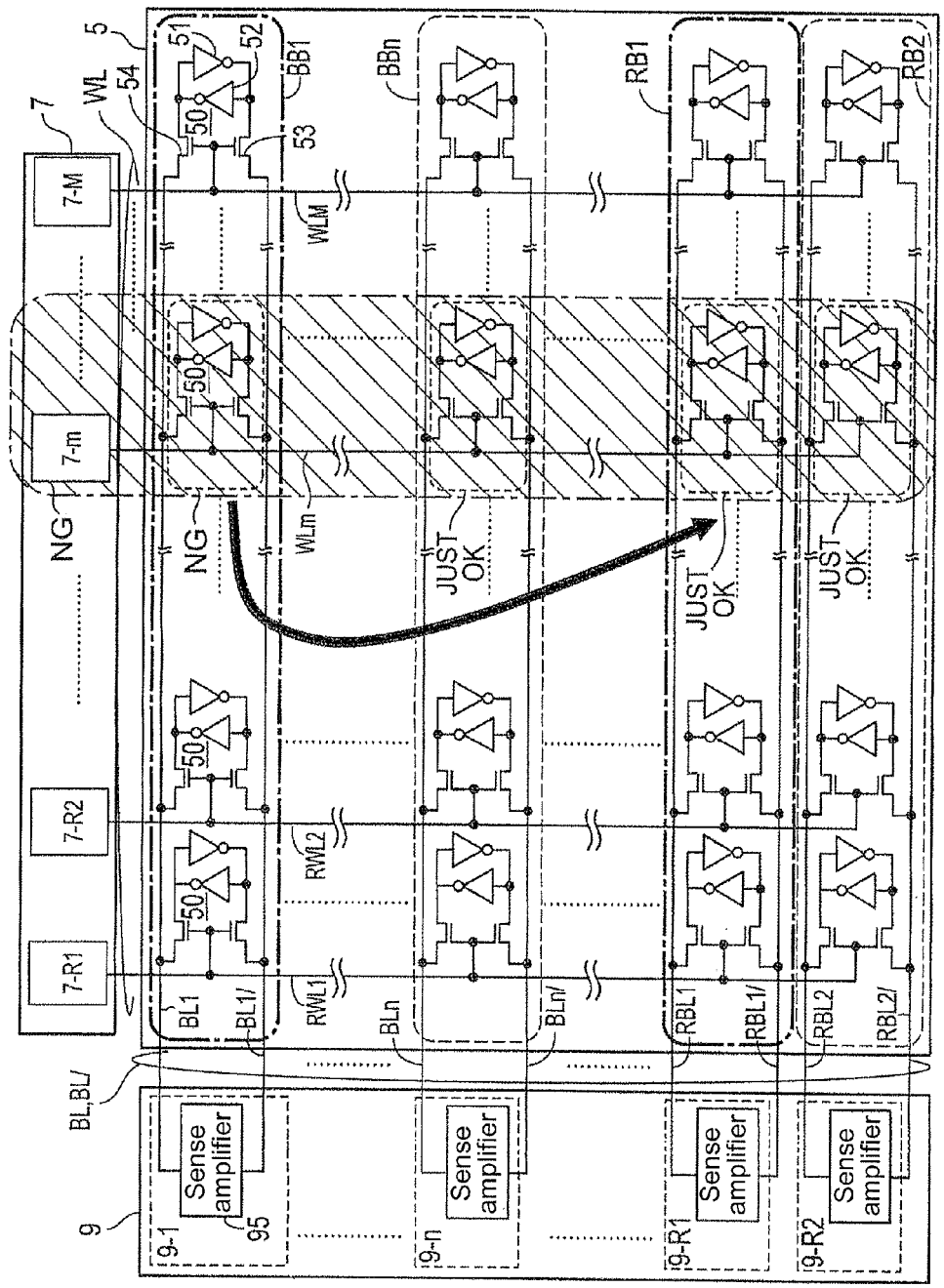
FIG. 27 is a circuit diagram showing a situation in which a defect caused by a defective word driver is being repaired in the memory circuit 100 in FIG. 22.

FIG. 27 shows a case of type K2 where a delay occurs in a rise of a word line WLm due to a word driver 7-$m$. In this case, the delay in the rise of the word line WLm increases inferiority of a memory cell. Here, by memory testing, the memory cell 50 of the column section BB1 connected to the word driver 7-$m$ is determined to be defective (indicated by "NG" in the drawing), and the memory cell 50 of the column section BBn or the redundancy column sections RB1 and RB2, while having a limit margin, is determined to be non-defective (indicated by "JUST OK" in the drawing).

If the memory testing method of Patent Document 2 is used, since a defective memory cell exists in the column section BB1, a repair for the defective memory cell may be performed so as to replace the column section BB1 with the redundancy column section RB1. Thereupon, in the replaced redundancy column section RB1, the memory cell 50 connected to the word driver 7-$m$ has a limit margin, and may become a defective cell due to, e.g., reduction in a supply voltage or rise in temperature. In this way, when a redundancy column is used in the case of word line-related failure, degradation in a redundancy memory cell as the replacement may occur due to environmental changes.

Figure 28:
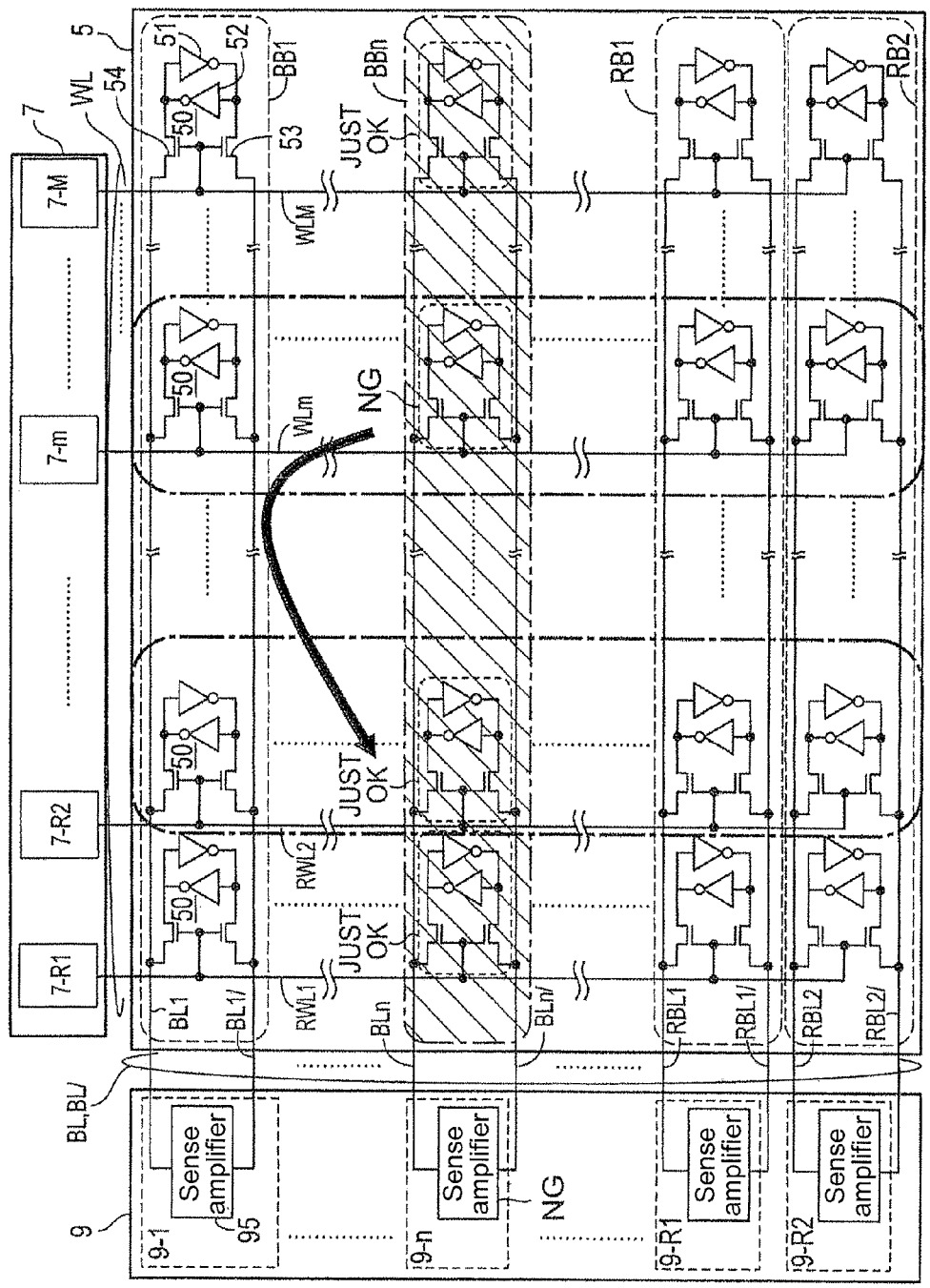
FIG. 28 is a circuit diagram showing a situation in which a defect caused by a defective sense amplifier is being repaired in the memory circuit 100 in FIG. 22.

FIG. 28 shows a case of type K3 where the sense amplifier 95 of the Y-decoder section 9-$n$ has a defect, thereby deteriorating the function of the sense amplifier 95. In this case, the deterioration in the function of the sense amplifier 95 increases inferiority of the memory cell in the column section BBn. Here, by memory testing, in the column section BBn, the memory cell 50 connected to the word driver 7-$m$ is determined to be defective; on the other hand, the memory cell 50 connected to the redundancy word driver sections 7-R1 and 7-R2, while having a limit margin, is determined to be non-defective.

According to the memory testing method of Patent Document 2, the repair for the defective memory cell may be performed so as to replace each memory cell 50 connected to the word driver 7-$m$ with the memory cell 50 connected to the redundancy word driver section 7-R2. Thereupon, in the column section BBn, the memory cell 50 connected to the replaced redundancy word driver section 7-R2 has a limit margin, and may become a defective cell due to, e.g., reduction in a supply voltage or rise in temperature. In this way, the use of a redundancy row in the case of column-related failure is not preferable from the viewpoint of degradation caused by the environment.

Accordingly, in the memory circuit 1B according to the present embodiment, by means of the redundancy address writing priority control circuit 28, a writing order of redundancy address is set to give priority to a redundancy row or a redundancy column. Accordingly, a redundancy repair for a defective cell can be suitably performed in accordance with the type of defect.

Figure 13:
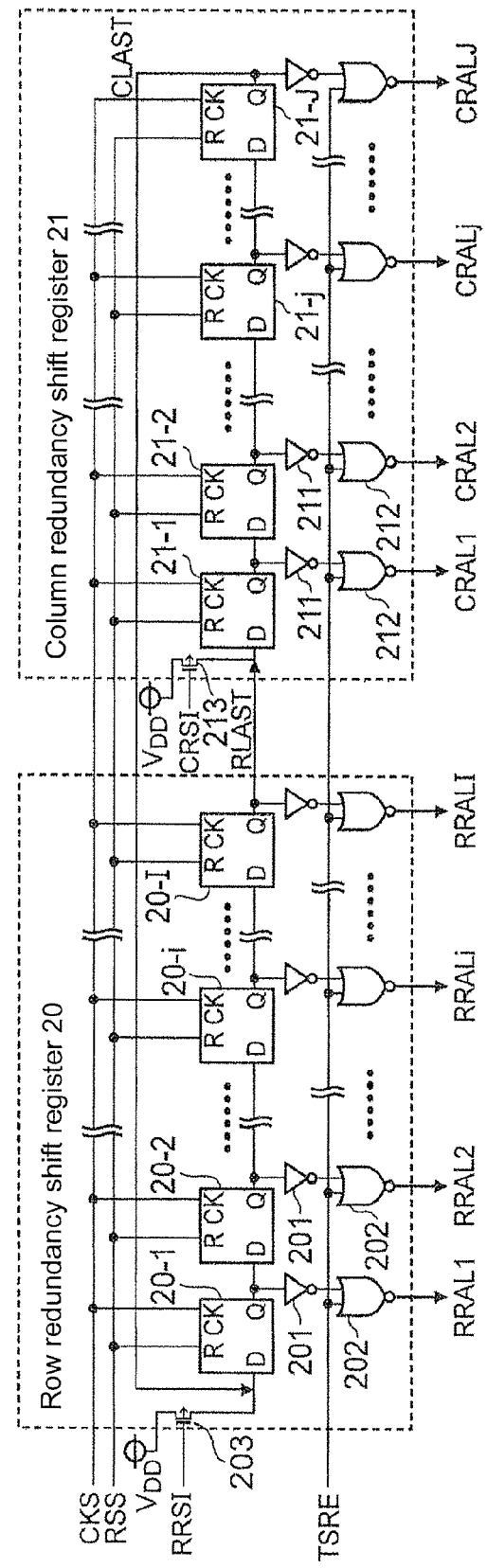
FIG. 13 is a circuit diagram showing a structure of a redundancy address writing priority control circuit 28 in the memory circuit 1B in FIG. 12.

FIG. 13 is a circuit diagram showing a structure of the redundancy address writing priority control circuit 28 in the memory circuit 1B in FIG. 12. In FIG. 13, the redundancy address writing priority control circuit 28 is configured by including a row redundancy shift register 20 and a column redundancy shift register 21. The row redundancy shift register 20 includes registers 20-1 to 20-I, a plurality of inverters 201, a plurality of NOR gates 202 and a transistor 203. The column redundancy shift register 21 includes registers 21-1 to 21-J, a plurality of inverters 211, a plurality of NOR gates 212 and a transistor 213.

In FIG. 13, an internal clock signal CKS and a priority control reset signal RSS are provided from the memory control circuit 10 shown in FIG. 12 to each register 20-$i$ ($i$=1, 2, ..., I) of the row redundancy shift register 20 and each register 21-$j$ ($j$=1, 2, ..., J) of the column redundancy shift register 21. Moreover, in the memory circuit 1B shown in FIGS. 12, I=2 and J=2. However, the invention is not limited thereto, and I and J may be any natural numbers. The memory control circuit 10 generates a row redundancy write start signal RRSI and a column redundancy write start signal CRSI, outputs the same to a gate of the PMOS transistors 203 and 213 respectively, and controls ON/OFF of the PMOS transistors 203 and 213. The memory control circuit 10 generates a transmission enable signal TSRE and outputs the same to the NOR gate 202.

In the row redundancy shift register 20, the PMOS transistor 203 is connected to the register 20-1, and the registers 20-1 to 20-I are connected to each other in series to constitute the shift register. Each register 20-$i$ holds a signal in synchronization with the internal clock signal CKS and outputs its held signal to the NOR gate 202 through the inverter 201. Each NOR gate 202 performs an NOR operation so as to generate a redundancy address write enable signal RRALi. The register 20-I is connected to the register 21-1 of the column redundancy shift register 21 by a signal line RLAST.

In the column redundancy shift register 21, the PMOS transistor 213 is connected to the register 21-1, and the registers 21-1 to 21-J are connected to each other in series to constitute the shift register. Each register 21-$j$ holds a signal in synchronization with the internal clock signal CKS and outputs its held signal to the NOR gate 212 through the inverter 211. Each NOR gate 212 performs an NOR operation so as to generate a redundancy address write enable signal CRALi. The register 21-J is connected to the register 20-1 of the row redundancy shift register 20 by a connecting line CLAST.

In the following, an operation of giving priority to a redundancy row or a redundancy column so as to set a redundancy address in the memory circuit 1B configured as above is described.

Figure 14:
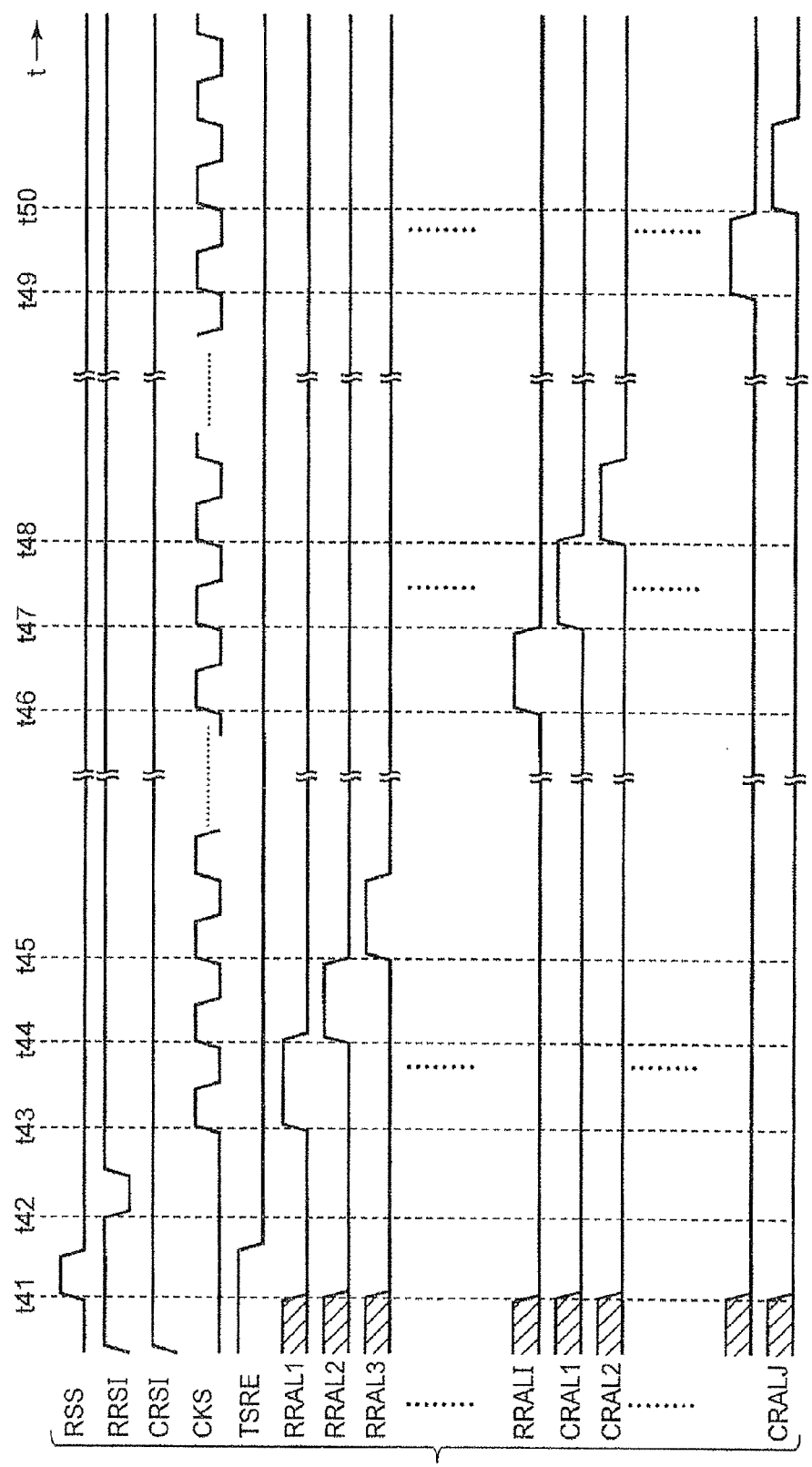
FIG. 14 is a timing chart of signals showing a row priority redundancy address capturing operation in the memory circuit 1B in FIG. 12.

FIG. 14 is a timing chart of signals showing a row priority redundancy address capturing operation in the memory circuit 1B in FIG. 12. An operation of preferentially setting a redundancy row address to a redundancy address latch circuit is described with reference to FIGS. 12 to 14.

In FIG. 14, firstly at time t41, the memory control circuit 10 generates a high-level priority control reset signal RSS and outputs the same to the redundancy address writing priority control circuit 28. In the redundancy address writing priority control circuit 28, the row redundancy shift register 20 and the column redundancy shift register 21 are reset. Furthermore, the memory control circuit 10 generates a low-level transmission enable signal TSRE and outputs the same to the redundancy address writing priority control circuit 28.

Next, at time t42, the memory control circuit 10 generates a low-level row redundancy write start signal RRSI and outputs the same to the gate of the PMOS transistor 203 in the row redundancy shift register 20. Accordingly, the PMOS transistor 203 is switched ON, and data "1" is inputted to the register 20-1 of the row redundancy shift register 20.

In the row redundancy shift register 20, each register 20-$i$ outputs the data "1" inputted from the register 20-1 to a register of a subsequent stage and outputs the same to the NOR gate 202 through the inverter 201 in synchronization with the internal clock signal CKS. Hence, at time t43, the redundancy address writing priority control circuit 28 generates a high-level redundancy address write enable signal RRAL1 and activates the redundancy address latch circuit 12-1 in synchronization with a rising edge of the internal clock signal CKS. Subsequently, from time t44 to time t46, in response to the rising edge of the internal clock signal CKS, high-level redundancy address write enable signals RRAL2 to RRALI are generated sequentially.

The register 20-I in the row redundancy shift register 20 is connected to the register 21-1 in the column redundancy shift register 21 by the signal line RLAST. Hence, at time t47, the redundancy address write enable signal CRAL1 becomes high level in synchronization with the rising edge of the internal clock signal CKS.

Similarly to each register 20-*i* in the row redundancy shift register 20, each register 21-*j* (j=1, 2, . . . , J) in the column redundancy shift register 21 operates in synchronization with the internal clock signal CKS. Hence, from time t48 to time t50, in response to the rising edge of the internal clock signal CKS, high-level redundancy address write enable signals CRAL2 to CRALJ are generated sequentially.

Figure 15:
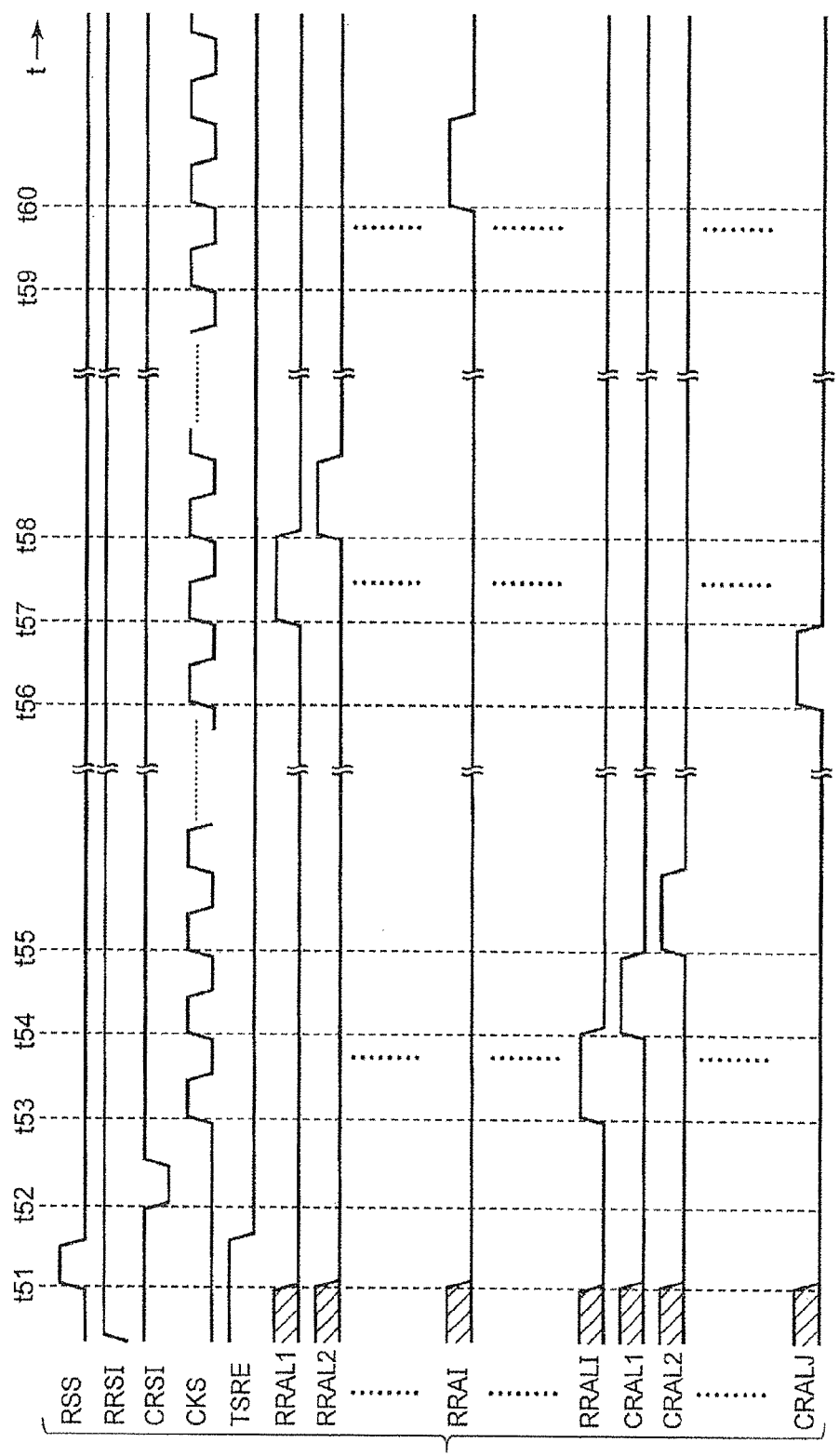
FIG. 15 is a timing chart of signals showing a column priority redundancy address capturing operation in the memory circuit 1B in FIG. 12.

FIG. 15 is a timing chart of signals showing a column priority redundancy address capturing operation in the memory circuit 1B in FIG. 12. An operation of preferentially setting a redundancy column address to a redundancy address latch circuit is described with reference to FIGS. 12 and 15.

In FIG. 15, firstly at time t51, the memory control circuit 10 generates a high-level priority control reset signal RSS, outputs the same to the redundancy address writing priority control circuit 28, and resets the row redundancy shift register 20 and the column redundancy shift register 21. Furthermore, the memory control circuit 10 generates a low-level transmission enable signal TSRE and outputs the same to the redundancy address writing priority control circuit 28.

Next, at time t52, the memory control circuit 10 generates a low-level column redundancy write start signal CRSI and outputs the same to the column redundancy shift register 21. Accordingly, the data "1" is inputted to the register 21-1 of the column redundancy shift register 21.

In the column redundancy shift register 21, each register 21-*j* outputs the data "1" inputted from the register 21-1 to a register of a subsequent stage and outputs the same to the NOR gate 212 through the inverter 211 in synchronization with the internal clock signal CKS. Hence, at time t53, the redundancy address writing priority control circuit 28 generates a high-level redundancy address write enable signal CRAL1 and activates the redundancy address latch circuit 12-3 in synchronization with the rising edge of the internal clock signal CKS. Subsequently, from time t54 to time t56, in response to the rising edge of the internal clock signal CKS, high-level redundancy address write enable signals CRAL2 to CRALJ are generated sequentially.

The register 21-J in the column redundancy shift register 21 is connected to the register 20-1 in the row redundancy shift register 20 by the connecting line CLAST. Hence, at time t57, the redundancy address write enable signal RRAL1 becomes high level in synchronization with the rising edge of the internal clock signal CKS.

Similarly to each register 21-*j* in the column redundancy shift register 21, each register 20-*i* in the row redundancy shift register 20 operates in synchronization with the internal clock signal CKS. Hence, from time t58 to time t60, in response to the rising edge of the internal clock signal CKS, high-level redundancy address write enable signals RRAL2 to RRALI are generated sequentially.

Figure 16:
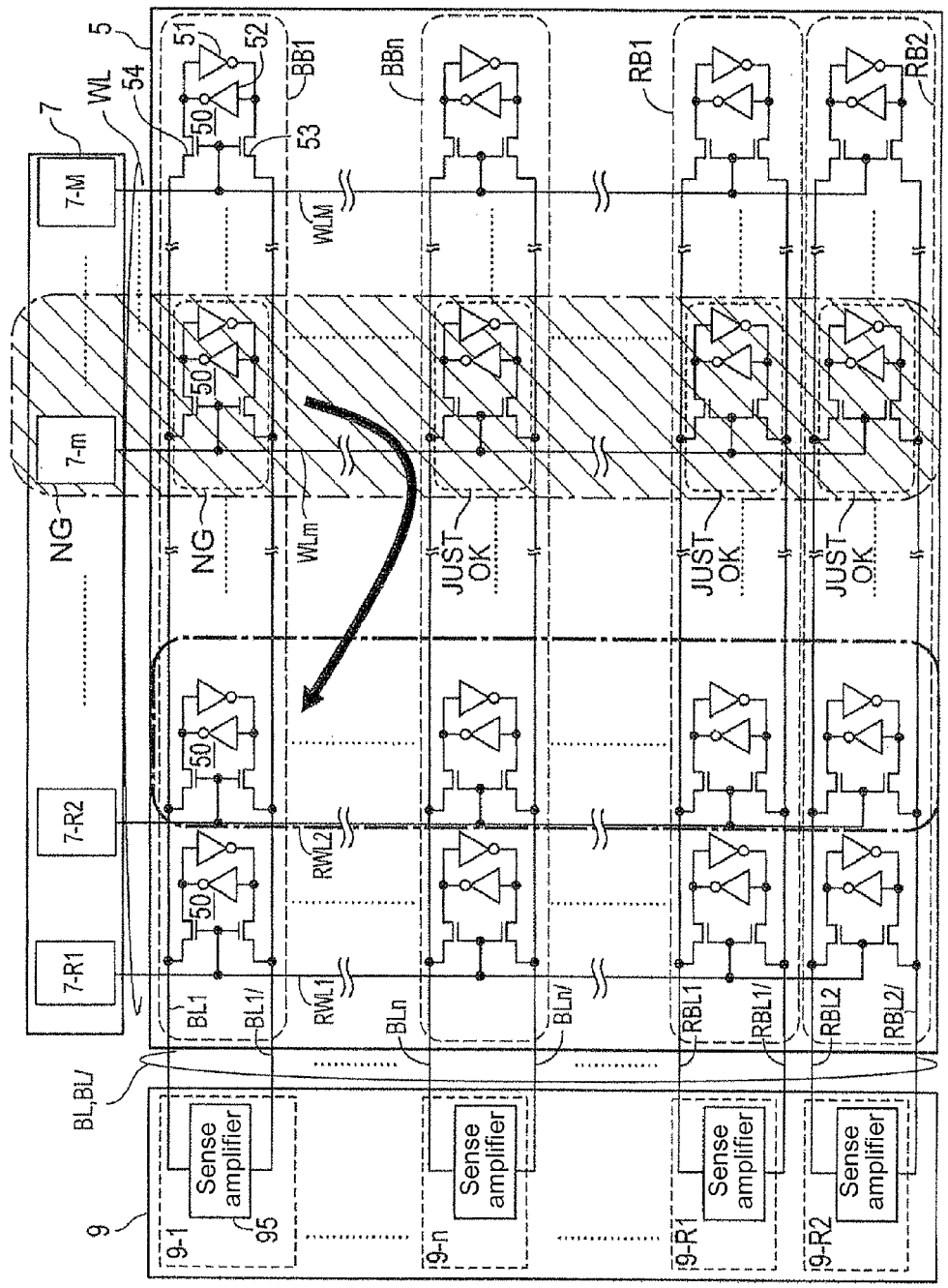
FIG. 16 is a circuit diagram showing a situation in which a defect caused by a defective word driver is being repaired in the memory circuit 1B in FIG. 12.
Figure 17:
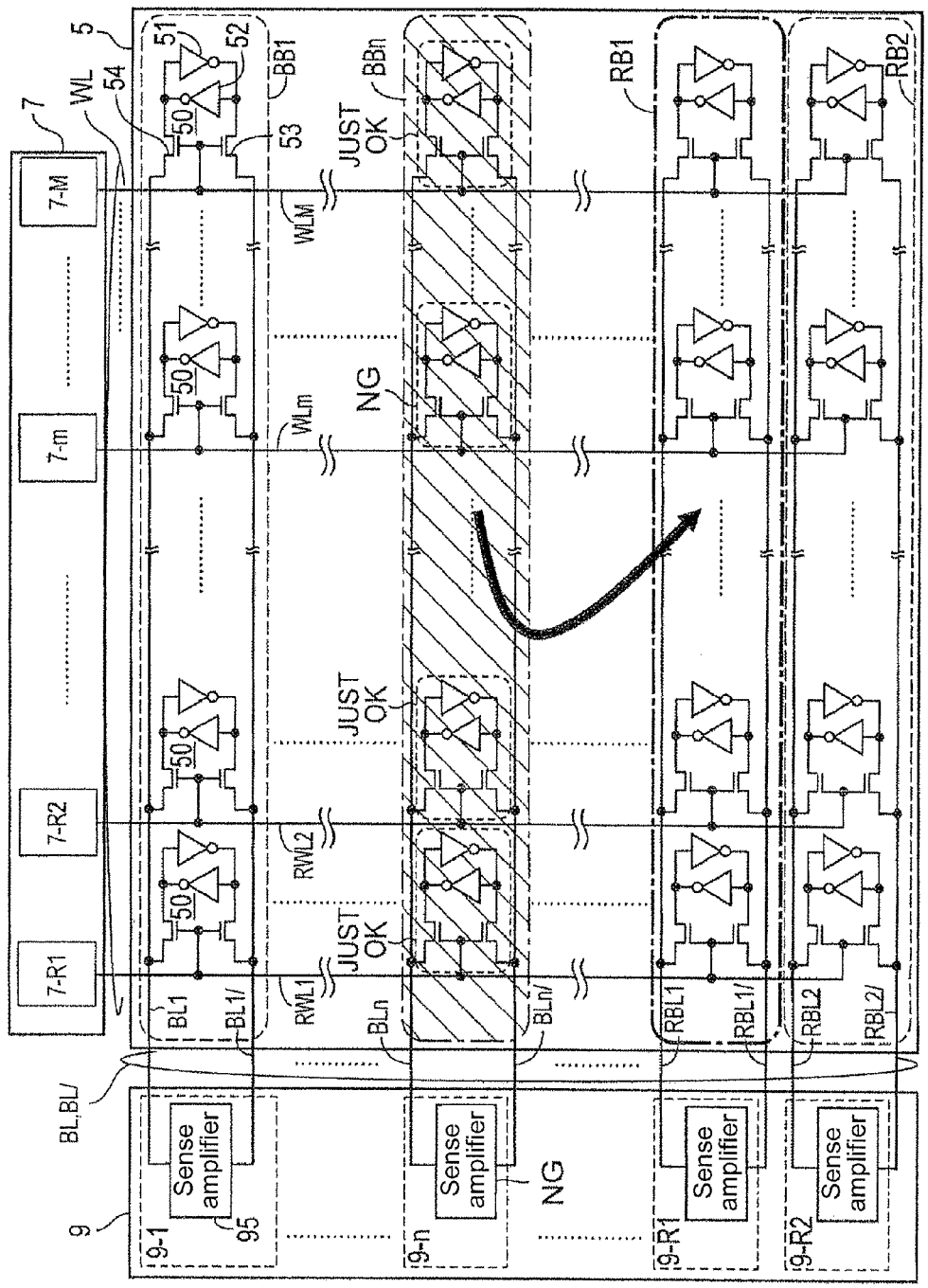
FIG. 17 is a circuit diagram showing a situation in which a defect caused by a defective sense amplifier is being repaired in the memory circuit 1B in FIG. 12.

FIG. 16 is a circuit diagram showing a situation in which a defect caused by a defective word driver is being repaired in the memory circuit 1B in FIG. 12. FIG. 17 is a circuit diagram showing a situation in which a defect caused by a defective sense amplifier is being repaired in the memory circuit 1B in FIG. 12. According to the memory circuit 1B configured as above, as described below, by means of the redundancy address writing priority control circuit 28, a redundancy scheme can be changed in accordance with the type of defect corresponding to a specific process in a manufacturing process.

In FIG. 16, similarly to the case shown in FIG. 27, due to the word driver 7-*m* having a defect, the rise of the word line WLm is delayed. In the memory circuit 1B according to the present embodiment, by an input of the row redundancy write start signal RRSI to the redundancy address writing priority control circuit 28, a redundancy row-preceding scheme to set a redundancy row address in advance of a redundancy column address can be selected. Hence, the repair for the defective memory cell can be performed so as to replace each memory cell 50 connected to the word driver 7-*m* with the memory cell 50 connected to the redundancy word driver section 7-R2. Accordingly, a cell of a limit margin connected to the word driver 7-*m* can be repaired together with the defective cell.

In FIG. 17, similarly to the case shown in FIG. 28, the sense amplifier 95 of the Y-decoder section 9-*n* has a defect, thereby deteriorating the function of the sense amplifier 95. In the memory circuit 1B according to the present embodiment, by an input of the column redundancy write start signal CRSI to the redundancy address writing priority control circuit 28, a redundancy column-preceding scheme to set a redundancy column address in advance of a redundancy row address can be selected. Hence, the repair for the defective memory cell can be performed so as to replace the column section BBn with the redundancy column section RB1. Accordingly, a cell of a limit margin in the column section BBn can be repaired together with the defective cell.

According to the memory circuit 1B configured as above, the redundancy address latch circuits 12-1 to 12-4 include: the redundancy address latch circuits 12-1 and 12-2, holding the redundancy row addresses P1 and P2 designating the word line WLa connected to the specific memory cell Cc; and the redundancy address latch circuits 12-3 and 12-4, holding the redundancy column addresses P3 and P4 designating the bit line BLc. The memory circuit 1B further includes: the redundancy address writing priority control circuit 28, preferentially selecting either the redundancy address latch circuits 12-1 and 12-2 or the redundancy address latch circuits 12-3 and 12-4, and controlling to write the redundancy row addresses P1 and P2 or the redundancy column addresses P3 and P4 in the selected redundancy address latch circuits.

According to the memory circuit 1B, by means of the redundancy address writing priority control circuit 28, a redundancy address write enable signal can be automatically generated. Furthermore, for example, depending on the situation of a problem occurring in a manufacturing process, either of the redundancy row-preceding scheme and the redundancy column-preceding scheme can be selected, and reliability of a memory product on the market can be improved. For example, if a representative chip in each wafer is taken out, and characteristics of a defective cell of a specific wafer lot are ascertained after all memory cells in the chip have been tested, it is ascertained that a defect of a sense amplifier is dominant in the lot. At that moment, a testing engineer, for example, can select the redundancy column-preceding scheme.

If the type of defect is column-related, by selection of the redundancy column-preceding scheme, a risk of occurrence of a memory cell of a limit margin in the replaced redundancy column section can be reduced. In addition, if the type of defect is row-related, by selection of the redundancy row-preceding scheme, the risk of occurrence of a memory cell of a limit margin in the replaced redundancy word line can be reduced.

In addition, the redundancy address writing priority control circuit 28 includes a shift register and has a smaller circuit area than a complicated circuit. Therefore, additional costs can be reduced without being accompanied by a huge region of a layout pattern.

Variant 1 of Embodiment 3

Figure 18:
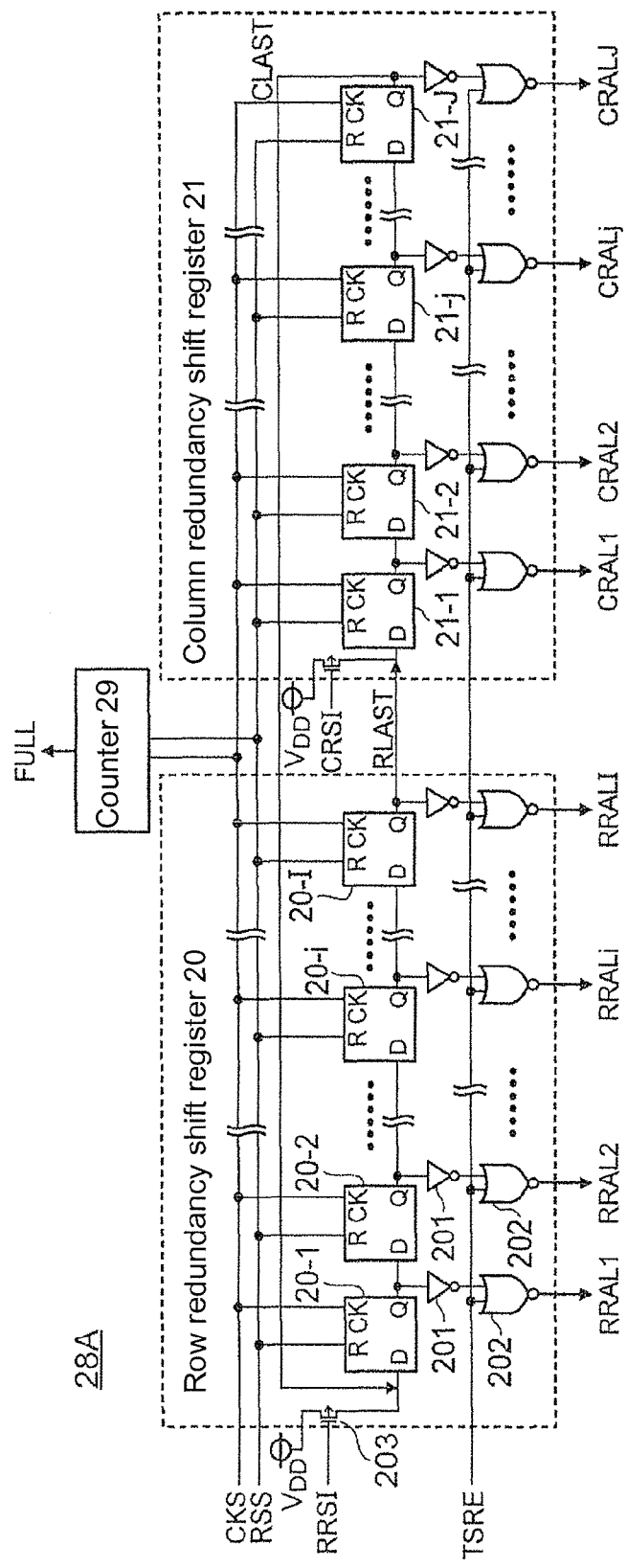
FIG. 18 is a circuit diagram showing a structure of a redundancy address writing priority control circuit 28A in Variant 1 of Embodiment 3.
Figure 19:
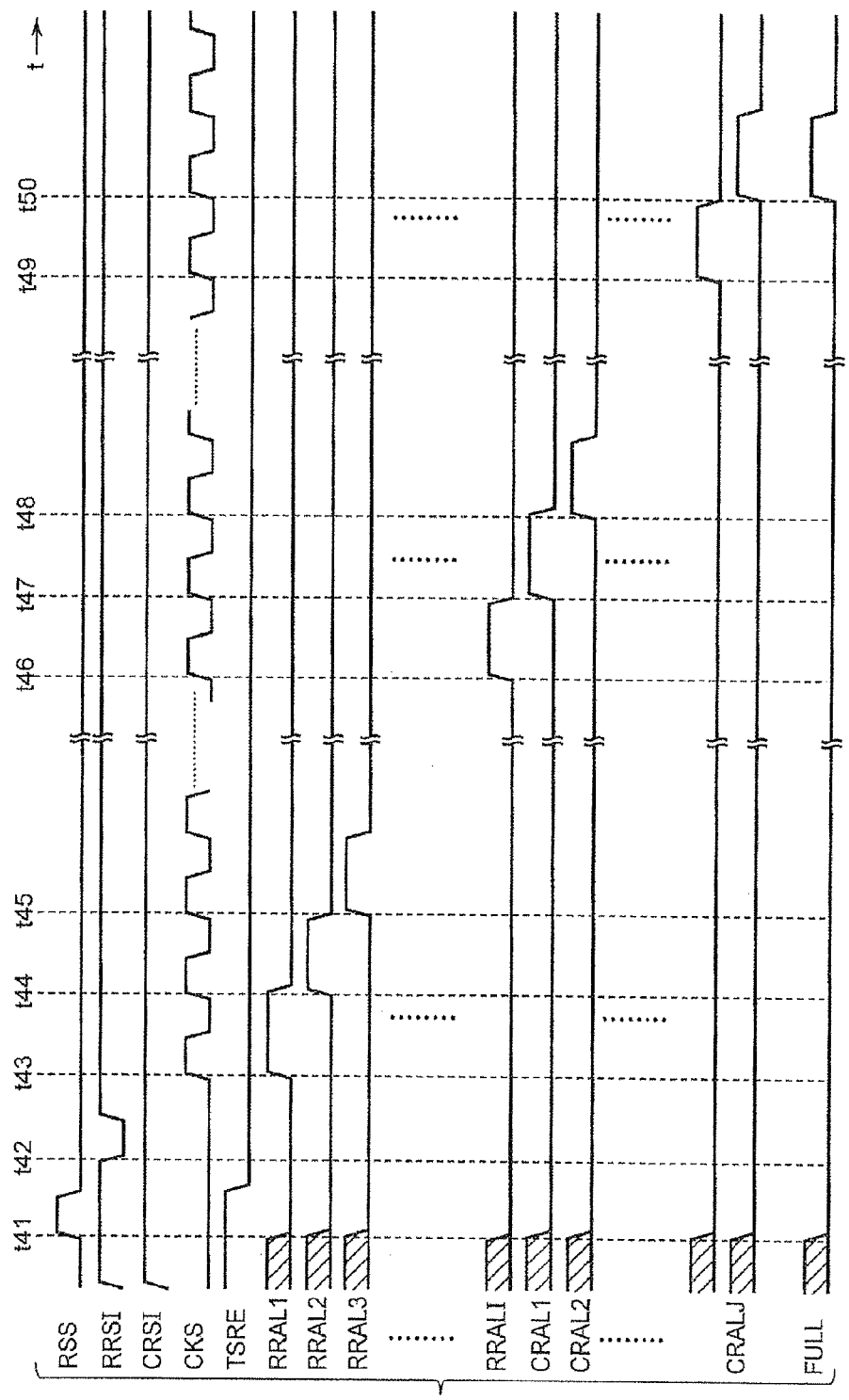
FIG. 19 is a timing chart of signals showing a redundancy address capturing operation performed by the redundancy address writing priority control circuit 28A in FIG. 18.

FIG. 18 is a circuit diagram showing a structure of a redundancy address writing priority control circuit 28A in Variant 1 of Embodiment 3. FIG. 19 is a timing chart of signals showing a redundancy address capturing operation performed by the redundancy address writing priority control circuit 28A in FIG. 18. Compared to the redundancy address writing priority control circuit 28 in Embodiment 3, the redundancy address writing priority control circuit 28A in Variant 1 of Embodiment 3 is characterized by further including a counter 29.

In FIG. 18, the counter 29 counts a pulse number of the internal clock signal CKS, and a count result of the internal clock signal CKS is reset by the priority control reset signal RSS. When the count result of the internal clock signal CKS has reached a total number (I+J) of the registers 20-1 to 20-I of the row redundancy shift register 20 and the registers 21-1 to 21-J of the column redundancy shift register 21, as shown in FIG. 19, a high-level flag signal FULL is generated.

If the memory circuit 1B is tested by the memory tester 2 or the BIST circuit 2A, it is necessary to grasp whether or not a redundancy address has been set to a redundancy address latch circuit. According to the redundancy address writing priority control circuit 28A, by means of the flag signal FULL of the counter 29, if a redundancy address has been set to all the redundancy address latch circuits, it can be determined that all the redundancy address latch circuits have been used. Hence, overwriting of a redundancy address can be prevented in advance, and whether or not to reset a redundancy address latch circuit can be determined.

Variant 2 of Embodiment 3

Figure 20:
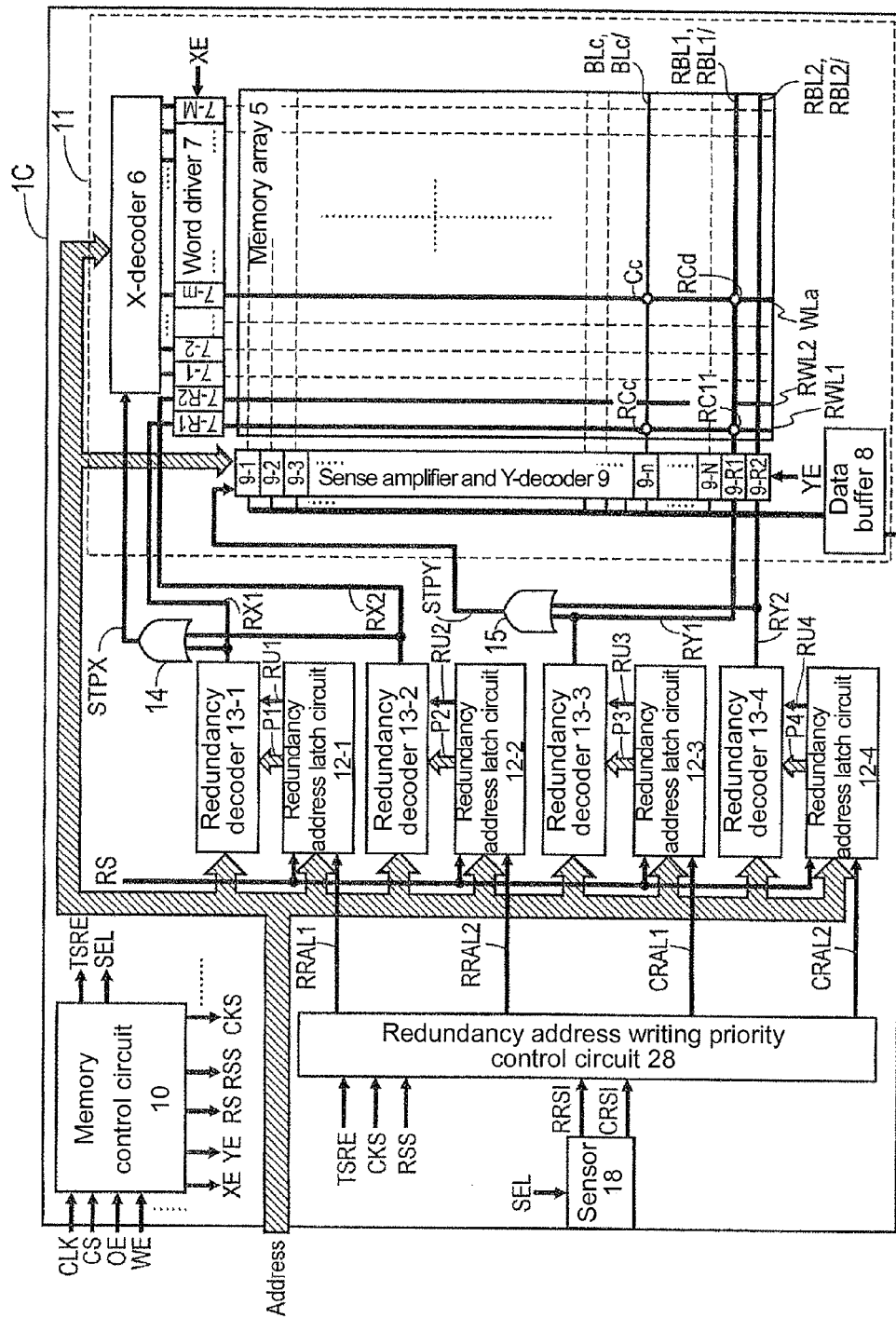
FIG. 20 is a block diagram showing a structure of a memory circuit 1C according to Variant 2 of Embodiment 3.
Figure 21:
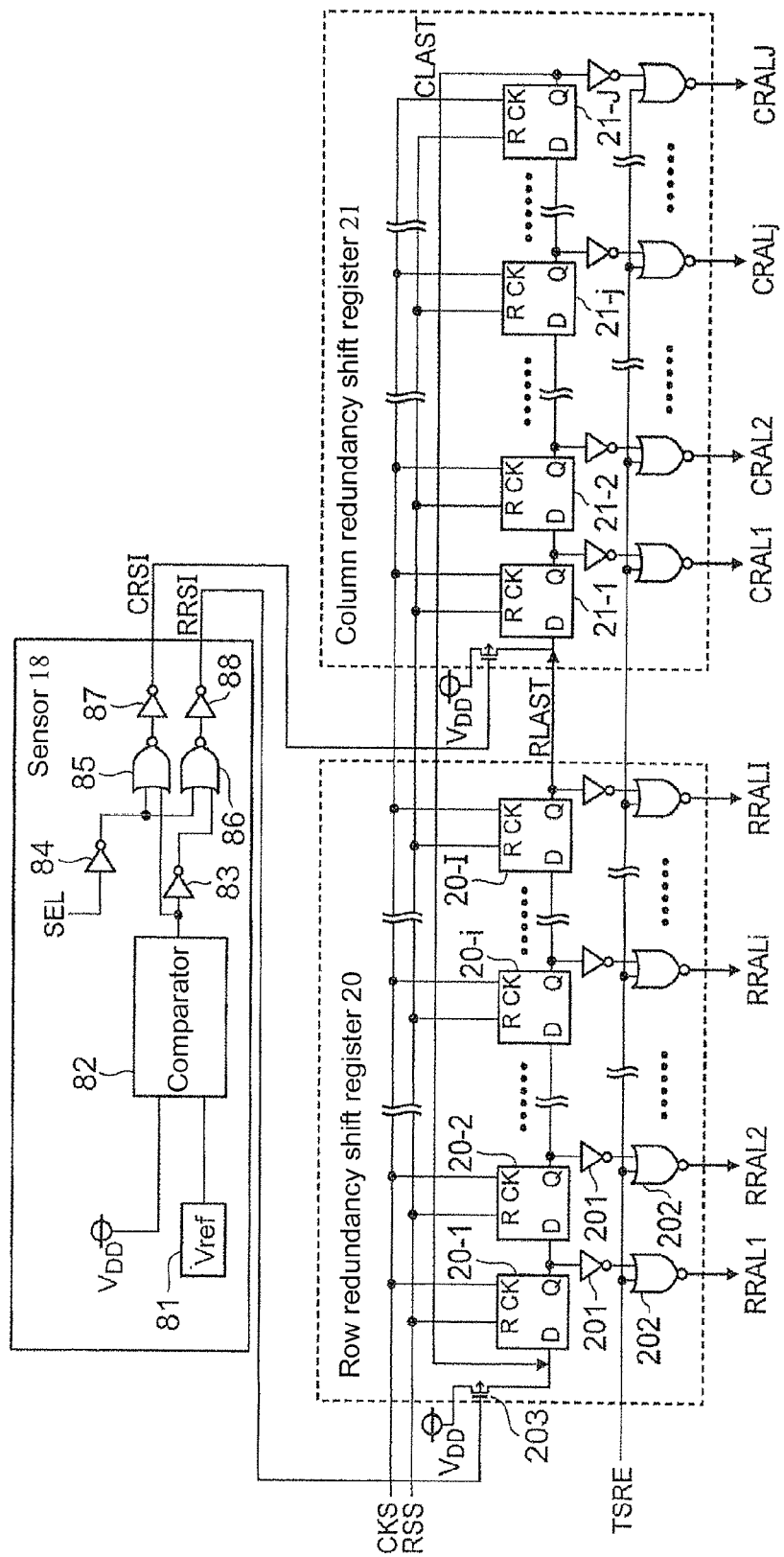
FIG. 21 is a circuit diagram showing a structure of a sensor 18 and the redundancy address writing priority control circuit 28 in the memory circuit 1C in FIG. 20.
Figure 22:
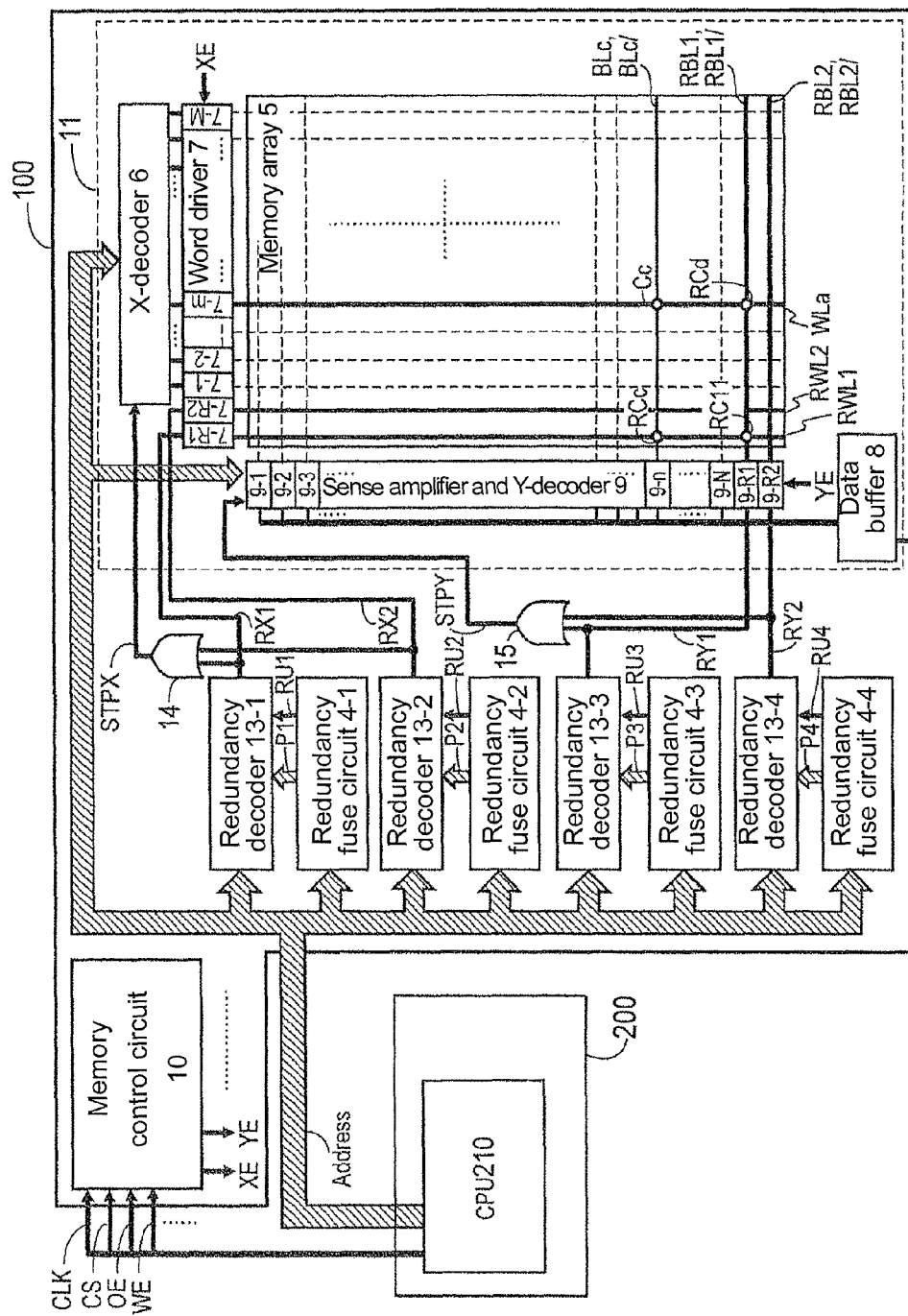
FIG. 22 is a block diagram showing a structure of the memory circuit 100 according to the prior art.
Figure 23:
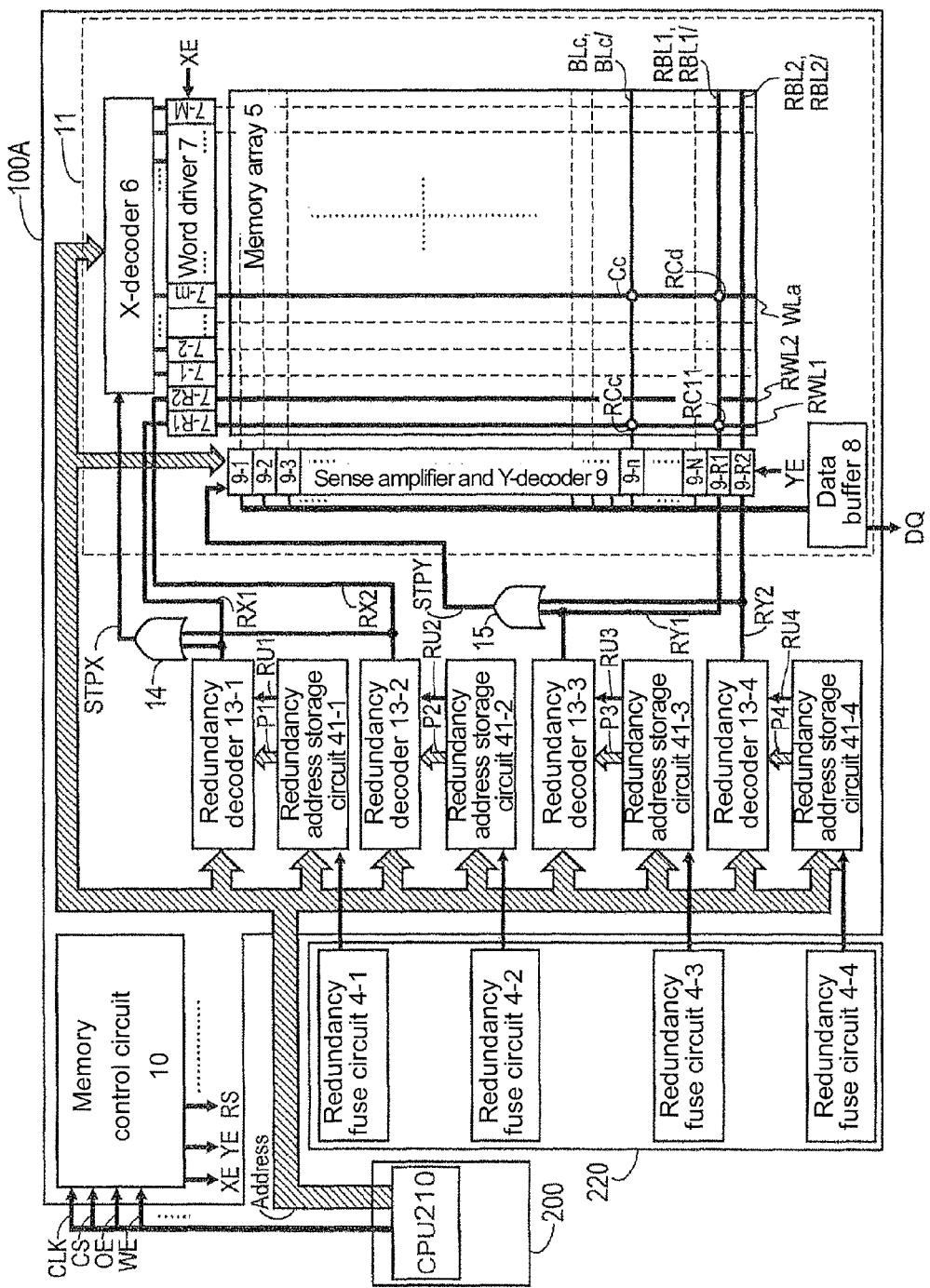
FIG. 23 is a block diagram showing a structure of the memory circuit 100A according to the prior art.
Figure 24:
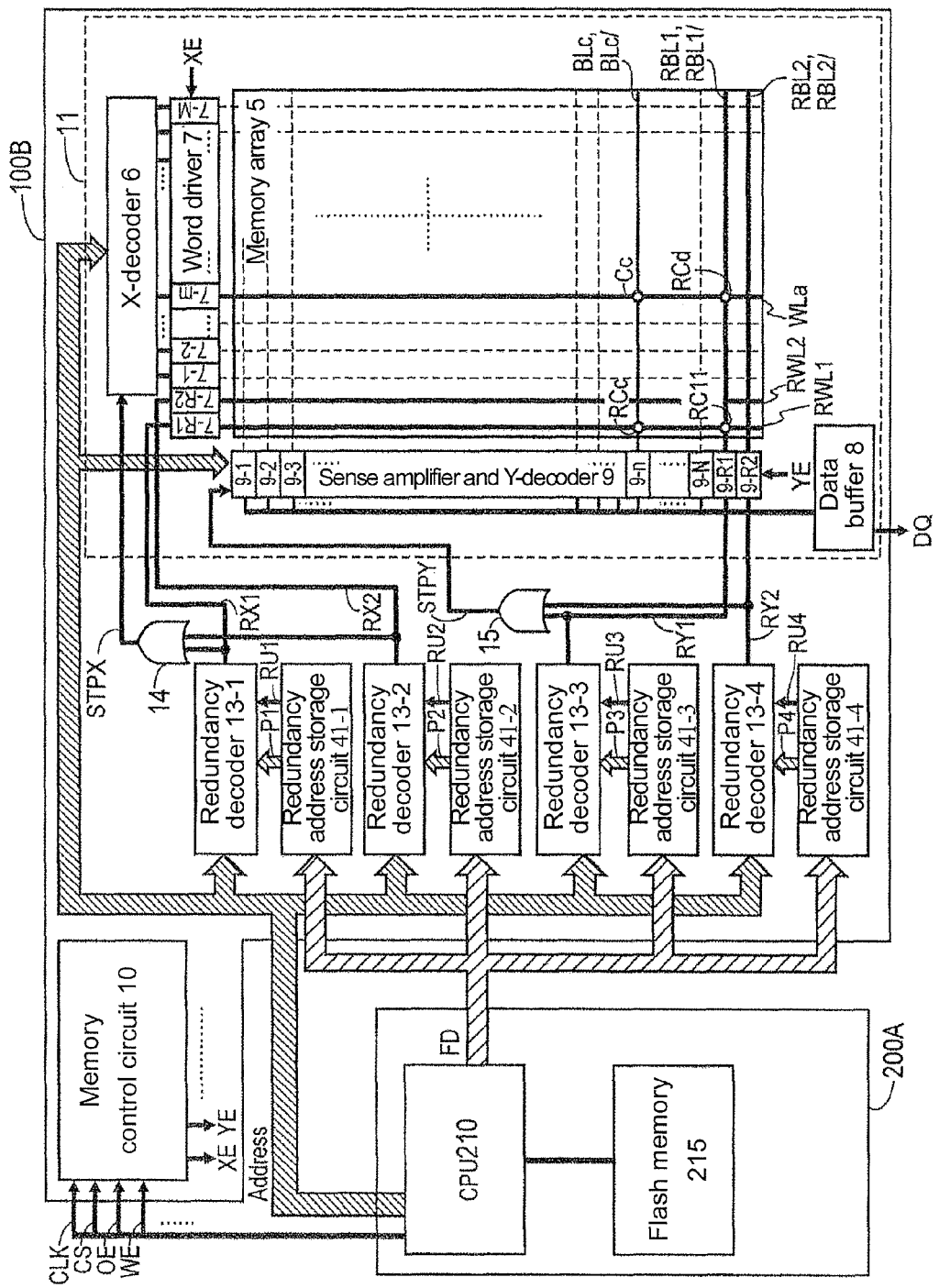
FIG. 24 is a block diagram showing a structure of the memory circuit 100B according to the prior art.
Figure 25:
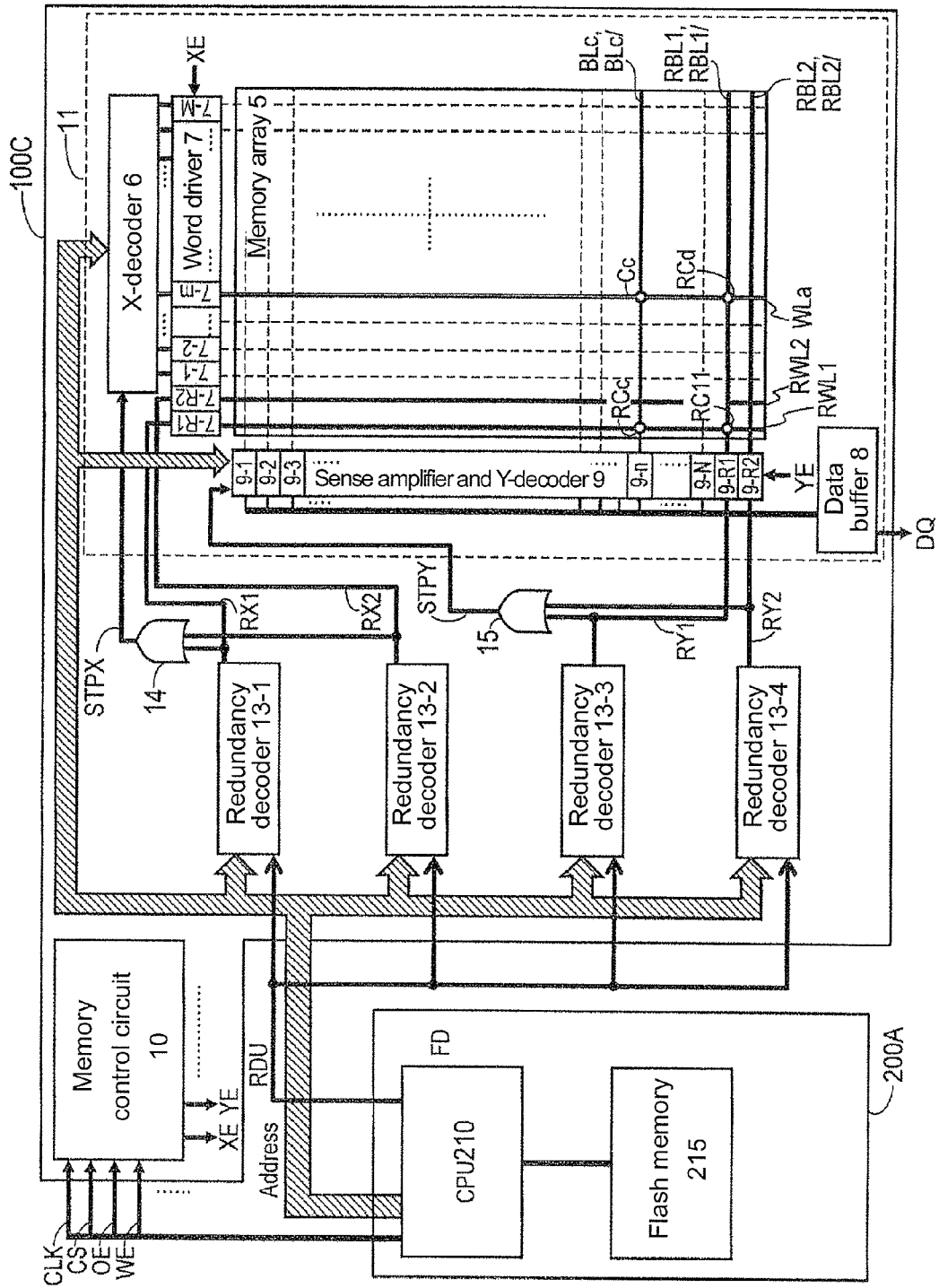
FIG. 25 is a block diagram showing a structure of the memory circuit 100C according to the prior art.
Figure 26:
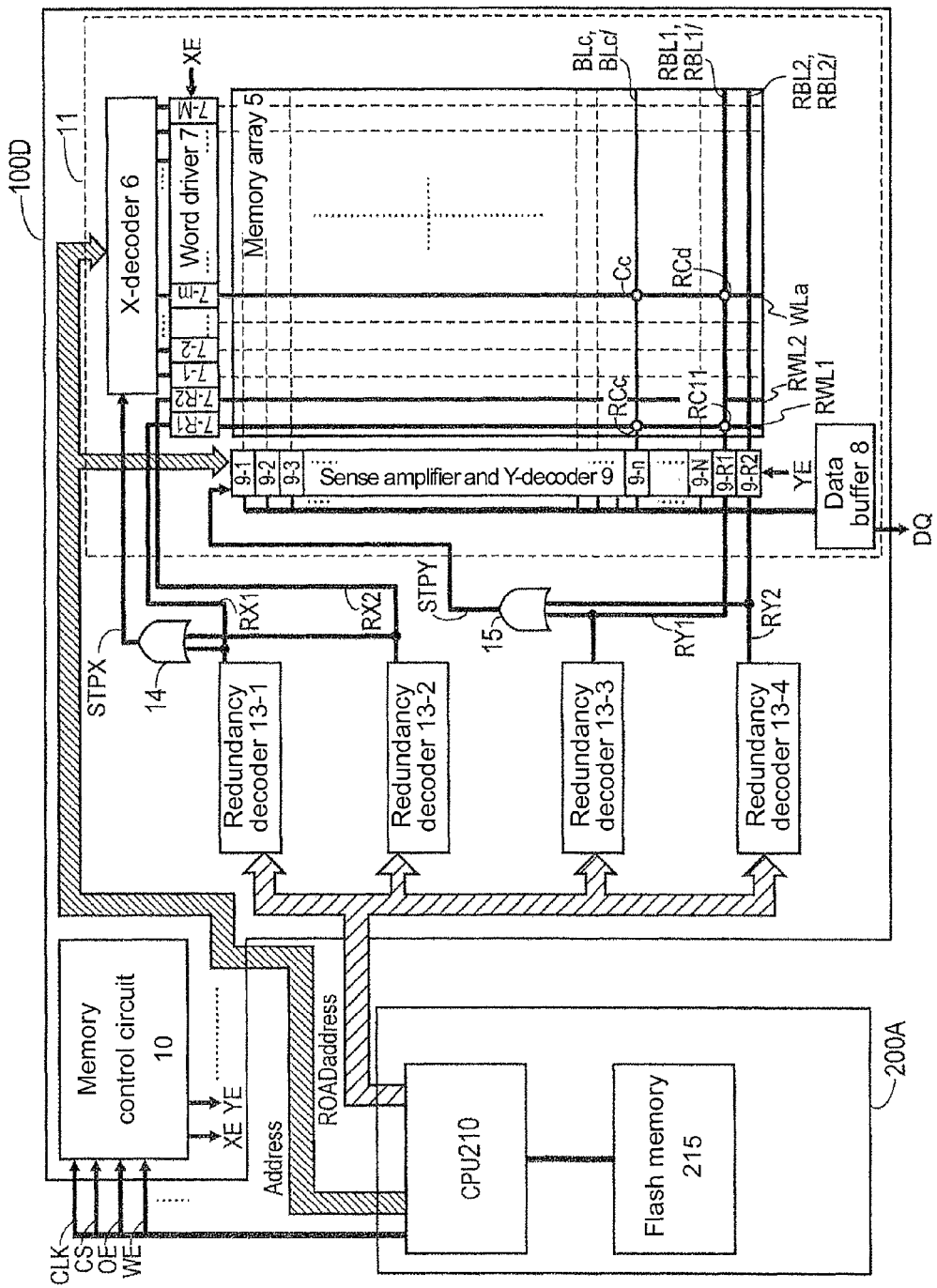
FIG. 26 is a block diagram showing a structure of the memory circuit 100D according to the prior art.

FIG. 20 is a block diagram showing a structure of a memory circuit 1C according to Variant 2 of Embodiment 3. FIG. 21 is a circuit diagram showing a structure of a sensor 18 and the redundancy address writing priority control circuit 28 in the memory circuit 1C in FIG. 20. Compared to the memory circuit 1B according to Embodiment 3, the memory circuit 1C according to Variant 2 of Embodiment 3 is characterized by further including the sensor 18.

In FIG. 20, the sensor 18 senses a temperature or a supply voltage of the memory circuit 1C, and generates a low-active row redundancy write start signal RRSI or column redundancy write start signal CRSI and outputs the same to the redundancy address writing priority control circuit 28 in response to a selection signal SEL from the memory control circuit 10. In FIG. 21, the sensor 18 is configured by including a reference voltage generation circuit 81, a comparator 82, inverters 83, 84, 87 and 88, and NOR gates 85 and 86. For example, if the sensed voltage or temperature is equal to or greater than a predetermined threshold value set according to a reference voltage Vref, the sensor 18 generates a low-level row redundancy write start signal RRSI to cause the column redundancy shift register 21 to operate; if the sensed voltage or temperature is less than the threshold value, the sensor 18 generates a low-level column redundancy write start signal CRSI to cause the row redundancy shift register 20 to operate.

Sense amplifier failure is more likely to occur when a semiconductor memory is used in a low-temperature environment than in a high-temperature environment. Hence, if the testing engineer has understood to use a semiconductor memory only in a high-temperature environment, and the sense amplifier-based failure only occurs in a low-temperature environment, it is preferred to select the redundancy row-preceding scheme. The reason is as follows. Generally, the number of redundancy rows is set greater than the number of redundancy columns, so that greater flexibility is obtained than column redundancy. By sensing the voltage or temperature by the sensor 18, and thereby selectively switching a redundancy scheme depending on an external environment, efficiency of a repair for failure can be easily improved.

Other Embodiments

The memory circuits 1, 1A, 1B and 1C according to the above embodiments include SRAM. However, the invention is not limited thereto. The memory circuit may also include a volatile random access memory such as DRAM or SDRAM, etc., or a non-volatile random access memory such as MRAM or FeRAM. Furthermore, the memory circuit does not always include a random access memory, but may also include ROM, PROM, and EEPROM, etc.

In addition, the redundancy address latch circuits 12-1 to 12-4 according to the above embodiments include SRAM. However, the invention is not limited thereto. The redundancy address latch circuit may also include a volatile memory.

In addition, the semiconductor integrated circuit apparatus according to Embodiment 2 is configured by including the memory circuit 1A. However, the invention is not limited thereto. The semiconductor integrated circuit apparatus may also be configured by including the memory circuits 1, 1B and 1C according to the embodiments.

What is claimed is:

1. A semiconductor memory apparatus, comprising:
   a plurality of memory cells, respectively connected to a plurality of word lines and bit lines intersecting each other, and storing data inputted from the bit lines;
   a memory control circuit, based on an address comprising a row address designating each of the word lines and a column address designating each of the bit lines, controlling an operation of reading the stored data from the memory cell connected to the word line and the bit line designated by the row address and the column address;
   a redundancy decoder, when the address comprises a redundancy address designating a word line or bit line connected to a specific memory cell, replacing the specific memory cell with a redundancy memory cell connected to a predetermined word line or bit line in the plurality of memory cells; and
   a plurality of redundancy address latch circuits, respectively holding the redundancy addresses, and erasing the held redundancy addresses based on a reset signal inputted from the memory control circuit.

2. The semiconductor memory apparatus of claim 1, wherein
   each of the redundancy address latch circuits holds the redundancy address based on a separately inputted enable signal.

3. The semiconductor memory apparatus of claim 1, further comprising:
   a fuse circuit, comprising fuses for storing the redundancy address in a non-volatile manner; and
   a switch circuit, selectively switching between the redundancy address held by the redundancy address latch circuit and the redundancy address stored in the fuse circuit, and outputting the same to the redundancy decoder, wherein
   when the address comprises a redundancy address from the switch circuit, the redundancy decoder replaces the specific memory cell with the redundancy memory cell.

4. The semiconductor memory apparatus of claim 3, further comprising:
   a first priority control circuit, when the fuse circuit has the redundancy address stored therein, causing the switch circuit to preferentially select the redundancy address stored in the fuse circuit over the redundancy address held by the redundancy address latch circuit.

5. The semiconductor memory apparatus of claim 1, wherein the plurality of redundancy address latch circuits comprise:

at least one first redundancy address latch circuit, holding a redundancy row address designating the word line connected to the specific memory cell; and at least one second redundancy address latch circuit, holding a redundancy column address designating the bit line connected to the specific memory cell, and wherein the semiconductor memory apparatus further comprises:

a second priority control circuit, controlling to preferentially select either of the first redundancy address latch circuit and the second redundancy address latch circuit, so as to write the redundancy row address or the redundancy column address in the selected redundancy address latch circuit.

6. The semiconductor memory apparatus of claim 5, further comprising:

a counter, counting a number of the first redundancy address latch circuit holding the redundancy row address and a number of the second redundancy address latch circuit holding the redundancy column address.

7. The semiconductor memory apparatus of claim 6, further comprising:

a sensor, detecting a temperature or a supply voltage of the semiconductor memory apparatus, wherein the second priority control circuit preferentially selects either of the first redundancy address latch circuit and the second redundancy address latch circuit depending on the temperature or the supply voltage detected by the sensor.

8. The semiconductor memory apparatus of claim 1, wherein each of the redundancy address latch circuits comprises a volatile storage circuit.

9. A semiconductor integrated circuit apparatus, comprising the semiconductor memory apparatus of claim 1.

* * * * *